(12) United States Patent
Pan

(10) Patent No.: US 10,848,270 B2
(45) Date of Patent: Nov. 24, 2020

(54) CONCATENATED FORWARD ERROR CORRECTION

(71) Applicant: Chunpo Pan, Nepean (CA)

(72) Inventor: Chunpo Pan, Nepean (CA)

(73) Assignee: CIENA CORPORATION, Hanover, MD (US)

( * ) Notice: Subject to any disclaimer, the term of this patent is extended or adjusted under 35 U.S.C. 154(b) by 107 days.

(21) Appl. No.: 16/204,735

(22) Filed: Nov. 29, 2018

(65) Prior Publication Data

US 2020/0177307 A1 Jun. 4, 2020

(51) Int. Cl.
| | | |
|---|---|---|
| *H04L 1/00* | (2006.01) | |
| *H03M 13/29* | (2006.01) | |
| *H04B 10/66* | (2013.01) | |
| *H04B 10/50* | (2013.01) | |
| *H03M 13/45* | (2006.01) | |

(52) U.S. Cl.
CPC ...... *H04L 1/0052* (2013.01); *H03M 13/2906* (2013.01); *H03M 13/45* (2013.01); *H04B 10/50* (2013.01); *H04B 10/66* (2013.01)

(58) Field of Classification Search
CPC ....... H04L 1/0052; H04B 10/66; H04B 10/50; H03M 13/45; H03M 13/2906
See application file for complete search history.

(56) References Cited

U.S. PATENT DOCUMENTS

| | | |
|---|---|---|
| 7,149,432 B1 | 12/2006 | Smith et al. |
| 9,088,387 B2 | 7/2015 | Oveis Gharan et al. |
| 9,537,608 B2 | 1/2017 | Oveis Gharan et al. |
| 9,698,939 B2 | 7/2017 | Oveis Gharan et al. |
| 2009/0129484 A1* | 5/2009 | He ........................ H04L 1/0065 375/240.26 |
| 2017/0019210 A1* | 1/2017 | Yu ............................ H04N 1/00 |
| 2019/0052403 A1* | 2/2019 | Oveis Gharan ... H03M 13/2948 |

OTHER PUBLICATIONS

Pending U.S. Appl. No. 15/672,434, filed Aug. 9, 2017.
(Continued)

*Primary Examiner* — April Y Blair
*Assistant Examiner* — Rong Tang
(74) *Attorney, Agent, or Firm* — Integral Intellectual Property Inc.; Amy Scouten; Miriam Paton

(57) ABSTRACT

An optical receiver is configured to receive optical signals representative of digital information over an optical communication link. The optical receiver is further configured to decode symbol estimates from an optical signal received over the optical communication link; to demap first bit estimates and second bit estimates from the symbol estimates; to decode third bit estimates from the first bit estimates using second FEC decoding of a second FEC scheme; and to decode fourth bit estimates from both the second bit estimates and the third bit estimates using first FEC decoding of a first FEC scheme. The optical receiver is further configured to use one or more of the third bit estimates to demap one or more of the second bit estimates. Concatenation of the first and second FEC schemes as described herein may relax design constraints on the second FEC scheme, which may reduce power consumption and design complexity.

18 Claims, 10 Drawing Sheets

(56) References Cited

OTHER PUBLICATIONS

Barakatain, et al., "Low-complexity concatenated LDPC-staircase codes", Journal of Lightwave Technology, vol. 36, No. 12, Jun. 2018.
Caire, et al., "Bit-Interleaved Coded Modulation", IEEE Transactions on Information Theory, vol. 44, No. 3, May 3, 1998.
Cho, et al., "Low-Complexity Shaping for Enhanced Nonlinearity Tolerance", 42nd European Conference and Exhibition on Optical Communications, Sep. 18-22, 2016.
Mizuochi, et al., "Experimental demonstration of concatenated LDPC and RS codes by FPGAs emulation", IEEE Photonics Technology Letters, vol. 21, No. 18, Sep. 2009.
Mizuochi, "Recent Progress in Forward Error Correction and Its Interplay With Transmission Impairments", IEEE Journal of Selected Topics in Quantum Electronics, vol. 12, No. 4, Jul./Aug. 2006.
Smith, et al., "Staircase Codes: FEC for 100 Gb/s OTN", Journal of Lightwave Technology, vol. 30, No. 1, Jan. 1, 2012.
Ungerboeck, "Channel Coding with Multilevel/Phase Signals", IEEE Transactions on Information Theory, vol. IT-28, No. 1, pp. 55-67, Jan. 1982., 1982.
Wachsmann, et al., "Multilevel Codes: Theoretical Concepts and Practical Design Rules", IEEE Transactions on Information Theory, vol. 45, No. 5, pp. 1361-1391, Jul. 5, 1999., 1999.
Zhang et al., "Low-complexity soft-decision concatenated LDGM-staircase FEC for high-bit-rate fiber-optic communication", Journal of Lightwave Technology, vol. 35, No. 18, Sep. 2017.
Zhang, et al., "Staircase Codes with 6% to 33% Overhead", Journal of Lightwave Technology (vol. 32, Issue: 10), May 15, 2014.
Pending U.S. Appl. No. 62/744,943, filed Oct. 12, 2018.

\* cited by examiner

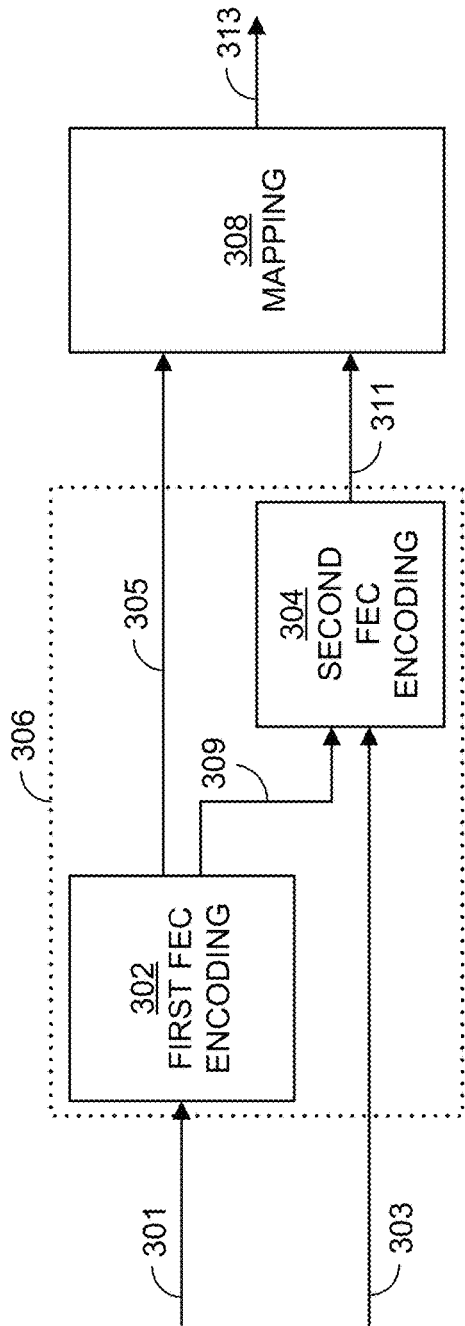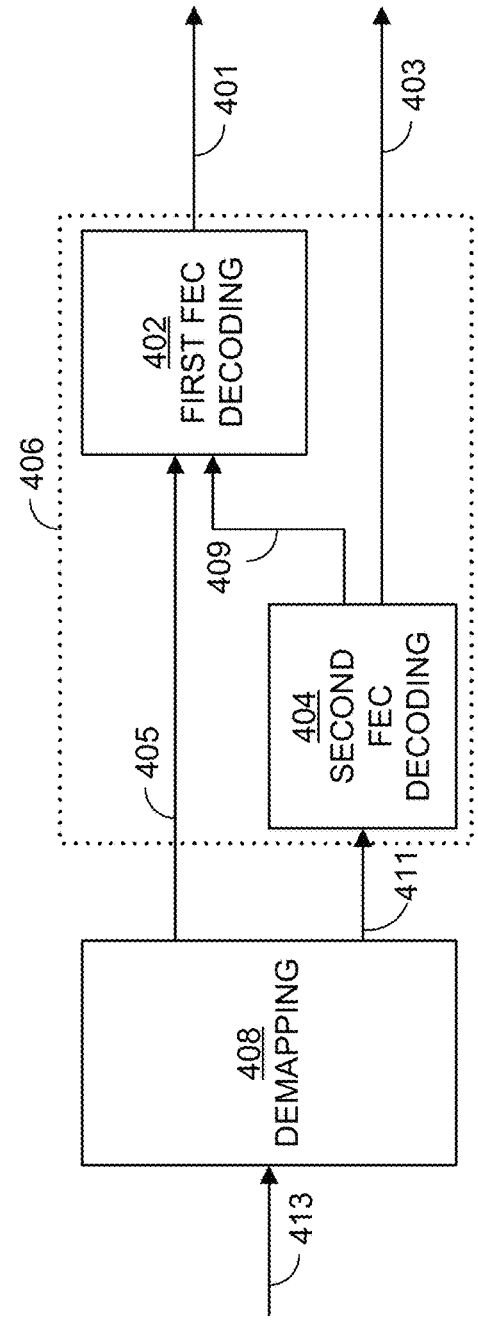

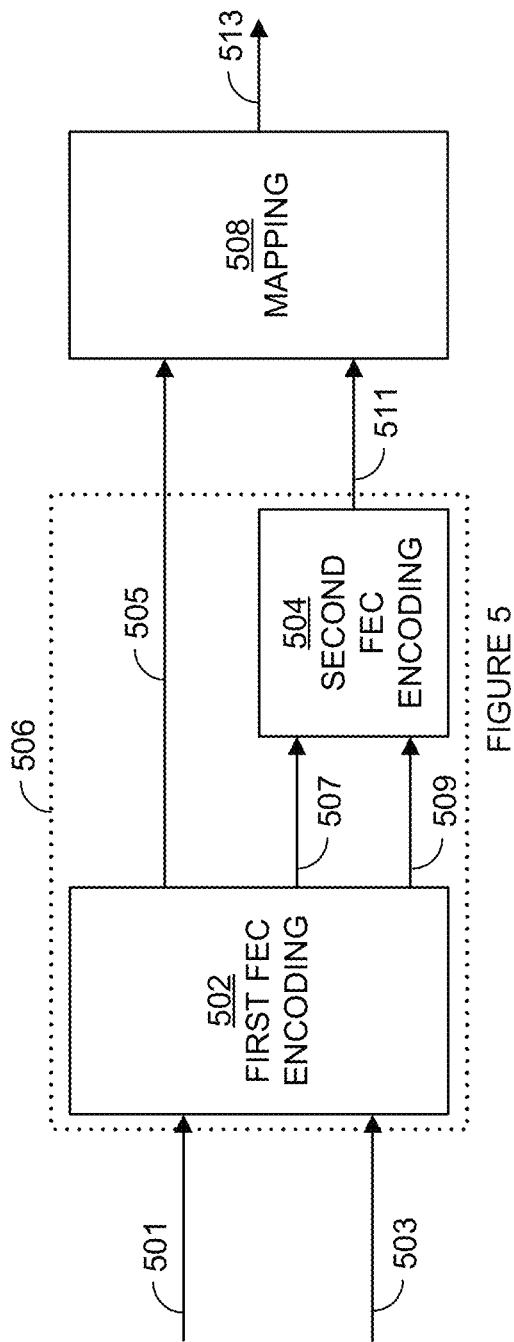
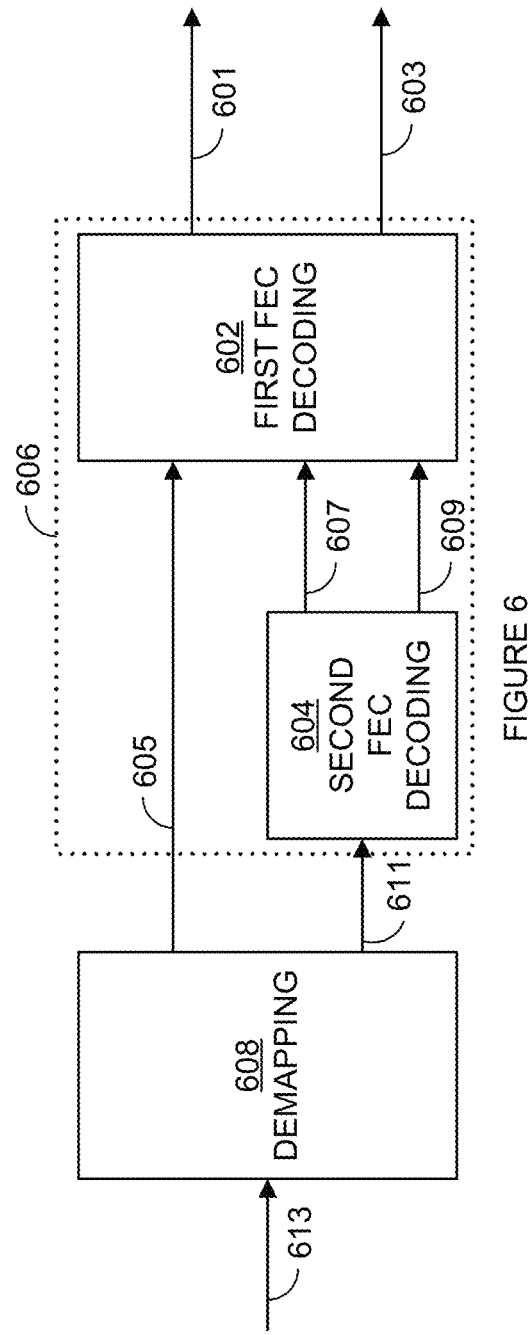

CONCATENATED FORWARD ERROR CORRECTION

TECHNICAL FIELD

This document relates to the technical field of optical communications.

BACKGROUND

In an optical communication system, an optical transmitter may encode digital information in the form of bits by mapping the bits to symbols, and then using a particular modulation scheme to modulate one or more optical carriers with the symbols. The optical transmitter thereby generates an optical signal to be transmitted via an optical communication channel to an optical receiver, where the optical signal is representative of the digital information. The optical receiver may process an optical signal received via the optical communication channel to recover estimates of the symbols, estimates of the bits, or both.

The optical signal received at the optical receiver may comprise a degraded version of the optical signal that was generated at the optical transmitter. Various components of the optical communication system, that may contribute to signal degradation, include optical fibers, optical amplifiers, filters, isolators, and the like. Amplifier noise, optical nonlinearity, polarization-dependent loss or gain (PDL or PDG), polarization mode dispersion (PMD), frequency-dependent loss, and other effects may introduce noise and/or distortion into the signal. The amplitude of the noise relative to the amplitude of the optical signal may be characterized by signal-to-noise ratio (SNR), or alternatively by noise-to-signal ratio (NSR). The NSR may be convenient when dissecting noise sources. A high NSR may result in noisy symbol estimates, which may in turn produce erroneous estimates of the bits. The probability that bit estimates recovered at the optical receiver differ from the original bits encoded at the optical transmitter may be characterized by the Bit Error Ratio or Bit Error Rate (BER). A given application may have a maximum BER tolerance. For example, an application may require that the BER does not exceed $10^{-15}$.

Forward Error Correction (FEC) techniques may be used to reduce the BER. Instead of mapping the original bits of information from the client (referred to as client bits) directly to symbols, the client bits may first undergo FEC encoding based on a chosen FEC scheme. The resulting FEC-encoded bits include redundant information, such as parity or check bits. The bit estimates recovered at the optical receiver are estimates of the FEC-encoded bits that were generated at the optical transmitter. These estimates may undergo FEC decoding at the optical receiver based on the chosen FEC scheme. The FEC decoding makes use of the redundant information that was included in the FEC-encoded bits in order to detect and correct bit errors. Ultimately, estimates of the original client bits may be recovered from the FEC-decoded bit estimates.

FEC encoding is advantageous in that it acts to reduce the received BER without the need to resend data packets. However, this is at the cost of an increased overhead. The amount of overhead or redundancy added by FEC encoding may be characterized by the information rate R, where R is defined as the ratio of the length of the input data sequence to the length of the output data sequence after FEC encoding (which includes the overhead). For example, if FEC encoding adds 25% overhead, then for every four bits that are to be FEC-encoded, the FEC encoding will add 1 bit of overhead, resulting in 5 FEC-encoded bits to be transmitted to the optical receiver. This corresponds to an information rate $R=4/5=0.8$.

SUMMARY

According to a broad aspect, an optical transmitter may be configured to transmit optical signals representative of digital information over an optical communication link established between the optical transmitter and an optical receiver. The optical transmitter may be configured to encode first bits using first FEC encoding of a first FEC scheme, thereby generating second bits and third bits, to encode the third bits using second FEC encoding of a second FEC scheme, thereby generating fourth bits, to map the second bits and the fourth bits to symbols, and to transmit an optical signal representative of the symbols. The optical transmitter may be configured to map the second bits and the fourth bits to the symbols based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is significantly greater than a minimum Euclidean distance of the set of constellation points.

According to some examples, the fourth bits may be mapped to the one or more first positions in the label, and the second bits may be mapped to other positions in the label.

According to some examples, the first FEC scheme may comprise a hard decision FEC scheme, and the second FEC scheme may comprise a soft decision FEC scheme.

According to some examples, a subset of the first bits may comprise shaped bits having unequal probabilities of being zero and being one, and the second bits may be identical to the shaped bits.

According to another broad aspect, an optical receiver may be configured to receive optical signals representative of digital information over an optical communication link established between the optical receiver and an optical transmitter. The optical receiver may be configured to decode symbol estimates from an optical signal received over the optical communication link, to demap first bit estimates and second bit estimates from the symbol estimates, to decode third bit estimates from the first bit estimates using second FEC decoding of a second FEC scheme, and to decode fourth bit estimates from both the second bit estimates and the third bit estimates using first FEC decoding of a first FEC scheme. The optical receiver may be configured to demap one or more of the second bit estimates using one or more of the third bit estimates.

According to some examples, the second bit estimates may have a BER that is significantly lower than a BER of the first bit estimates.

According to some examples, the first bit estimates and the second bit estimates may be demapped from the symbol estimates based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is significantly greater than a minimum Euclidean distance of the set of constellation points.

According to some examples, the first bit estimates may be demapped from the one or more first positions in the label, and the second bit estimates may be demapped from other positions in the label.

According to some examples, the first FEC scheme may comprise a hard decision FEC scheme, and the second FEC scheme may comprise a soft decision FEC scheme.

According to some examples, the optical receiver may demap one or more of the second bit estimates using one or more of the fourth bit estimates.

According to some examples, the optical receiver may iteratively demap one or more of the first bit estimates using one or more of the fourth bit estimates.

According to some examples, the optical receiver may iteratively decode one or more of the third bit estimates using one or more of the fourth bit estimates.

BRIEF DESCRIPTION OF THE DRAWINGS

FIG. 3 illustrates an example FEC encoding scheme;

FIG. 4 illustrates an example FEC decoding scheme for use with the FEC encoding scheme of FIG. 3;

FIG. 5 illustrates an example FEC encoding scheme in accordance with the technology disclosed herein;

FIG. 6 illustrates an example FEC decoding scheme for use with the FEC encoding scheme of FIG. 5;

DETAILED DESCRIPTION

Figure 1:
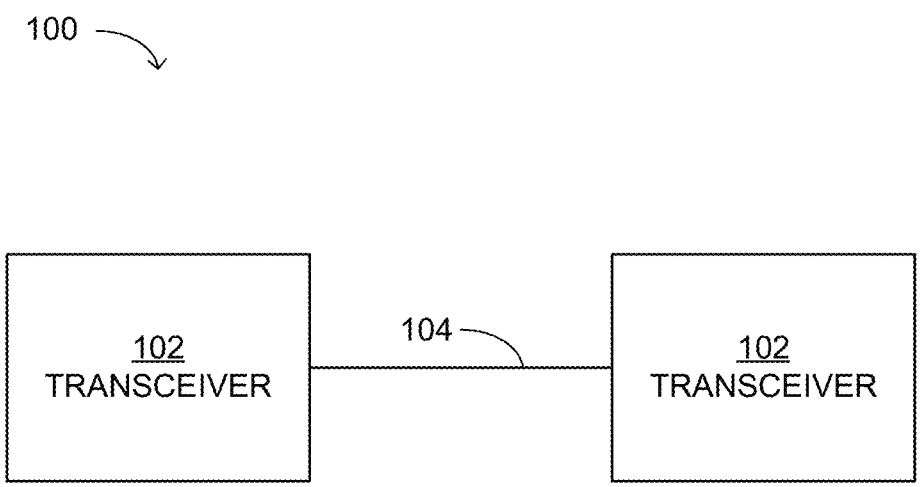
FIG. 1 illustrates an example optical communication system in accordance with the technology disclosed herein.

FIG. 1 illustrates an optical communication system 100 in accordance with the technology disclosed herein. The communication system 100 comprises optical transceivers 102. An optical signal, representative of digital information, is transmitted between the optical transceivers 102 via an optical communication channel 104 established over an optical communication link between the optical transceivers 102. For the purposes of the present disclosure, it is convenient to consider the optical signal as a function of four orthogonal dimensions versus time. The four orthogonal dimensions comprise the respective in-phase (I) and quadrature (Q) components of each of two orthogonal polarizations, denoted generically as X and Y. For notation purposes, the four dimensions at a particular time interval, t, may be denoted as XI(t), XQ(t), YI(t), and YQ(t).

The optical transceivers 102 may be flexible, such that various configuration parameters of the optical transceivers 102 can be adjusted. For the optical communication system 100 to be operable, the configuration parameters of a transmitter section of one of the optical transceivers 102 must be compatible with the configuration parameters of an optical receiver section of the other of the optical transceivers 102. Examples of configuration parameters include, but are not limited to, a modulation format or scheme, a symbol rate, forward error correction (FEC) parameters, digital signal processing (DSP) parameters, pulse shaping parameters, the number of subcarriers for frequency division multiplexing (FDM), chromatic dispersion compensation parameters, carrier phase recovery parameters, and digital nonlinear compensation parameters.

A signal transmitted via the optical communication channel 104 may be altered by various elements of the optical communication system, such as optical fibers, optical amplifiers, filters, isolators, wavelength-selective switches, and the like. For example, the passage of a signal through an optical fiber or an optical filter may attenuate the optical signal, whereas the passage of the signal through an optical amplifier may strengthen the signal and contribute noise. The signal loss (or signal gain) caused by a given component may depend on the polarization state of the signal. In general, this effect is referred to as polarization-dependent loss or gain (denoted PDL or PDG). Where information is transmitted on a carrier frequency using two orthogonal polarization states, a given element of the system may cause each polarization to experience a different level of PDL. PDL is cumulative across all elements in the optical communication system. As a result of PDL, the optical signal-to-noise ratio (OSNR) on one polarization may be lower than the OSNR on the other polarization.

Random imperfections or mechanical stresses in an optical fiber may cause light in two orthogonal polarizations to propagate with different group velocities. This effect, referred to as polarization mode dispersion (PMD), causes the two polarization components of a signal to drift apart over the length of an optical fiber, thereby causing pulse broadening and distortion. An optical system may be characterized by a mean value of the PMD, also referred to as the mean differential group delay (DGD). PMD compensation may be achieved using an adaptive filter at the optical receiver, such as a least-mean-squares (LMS) circuit. However, an LMS circuit may add a correlation between noise components of the symbols at different times.

Degradations in the optical signal may also be dependent on frequency. For example, different FDM channels may experience different levels of attenuation, or different levels of distortion following optical filtering.

The reliability of a communication channel may be characterized by the Bit Error Ratio or Bit Error Rate (BER), which measures the ratio of erroneously received bits to the total number of bits that are transmitted over the communication channel. The term "client bits" may herein be understood to refer to original bits intended for communication from a transmitter to a receiver in a communication system. The term "bits" may herein be understood to comprise client bits, or bits calculated from client bits, or both.

In a standard coherent transmission system, an optical transmitter may encode bits by mapping them to symbols, where each symbol is selected from a set of M possible symbol candidates. The $K^{th}$ symbol may be denoted by a vector $\vec{S}_K = [S_{K,1}, S_{K,2}, \ldots S_{K,N}]$, where $S_{K,i}$ is the $i^{th}$ component of the $K^{th}$ symbol vector, and N is the number of dimensions. Each symbol may be uniquely mapped to an optical signal, such that each component of the symbol vector is mapped to a respective dimension XI, XQ, YI, YQ, across one or more time intervals, and across one or more FDM subcarriers. Together, the M symbol candidates form an M-point constellation.

The term "visitation probability" is used herein to refer to the probability that a particular point in a constellation is selected to represent a set of bits. For example, given an M-point constellation, the visitation probability for the $K^{th}$ point in the constellation may be denoted by $P_K$, for $K=1,2,\ldots,M$.

The average power $\langle E \rangle$ of all the points in an M-point constellation may be calculated using Eq. 1.

$$\langle E \rangle = \Sigma_{K=1}^M P_K |\vec{S}_K|^2 \quad (1)$$

where $|\vec{S}_K|^2$ denotes the power of the $K^{th}$ constellation point.

The entropy H, measured in bits, of the encoding may be calculated using Eq. 2.

$$H = -\Sigma_{K=1}^M P_K \log_2(P_K) \quad (2)$$

For conventional modulation, the visitation probabilities of all symbols are equal, and the entropy is $H=\log_2(M)$. If the symbols transmitted in different time intervals are statistically independent, the constellation is capable of encoding $N_B=H$ bits per symbol. If the symbols transmitted in different time intervals are dependent, the constellation is only capable of encoding $N_B \leq H$ bits per symbol.

In a conventional coherent transmission system, the mapping of bits to symbols generally results in an unbiased selection of constellation points from the M possibilities, and symbols in different time intervals are independent of each other. That is, bits are encoded such that each point in the M-point constellation has the same visitation probability, namely $P_K=1/M$. Under these circumstances, Eq. 2 dictates that the M-point constellation will encode a total of $N_B=\log_2(M)$ bits per symbol.

Improvements in additive white Gaussian noise (AWGN) tolerance may be achieved by attempting to minimize the average symbol power $\langle E \rangle$ for a specified per-symbol data rate $N_B$ and a specified minimum Euclidean distance among the constellation points. As shown in Eq. 1, the average symbol power $\langle E \rangle$ is dependent on the power $|\vec{S}_K|^2$ of each of the M constellation points and its respective visitation probability $P_K$. At a constant SNR, constellation entropy H, and a fixed minimum Euclidean distance, the optimal visitation probabilities in an AWGN channel are those that follow a Maxwell-Boltzmann distribution characterized by a parameter $\lambda > 0$ (Eq. 3).

$$P_K = \frac{\exp(-\lambda |\vec{S}_K|^2)}{\sum_{K=1}^M \exp(-\lambda |\vec{S}_K|^2)} \quad (3)$$

In general, the optimal visitation probabilities for the points in a constellation may be unequal, such that $P_K \neq 1/M$. Techniques used to achieve unequal visitation probabilities are generally referred to as "probabilistic constellation shaping" or PCS. PCS may be used to improve the AWGN tolerance relative to conventional modulation. In addition, PCS can also be utilized to vary the raw capacity, in a substantially continuous manner, without requiring the support for multiple discrete constellations.

According to some examples, PCS may be implemented by applying shape encoding prior to FEC encoding at an optical transmitter, and by subsequently applying shape decoding after FEC decoding at a corresponding optical receiver. For example, the shape encoding may be applied to blocks of client bits at the optical transmitter to produce shaped bits, each shaped bit having an unequal probability of being zero and being one. The shaped bits may be FEC-encoded and ultimately mapped to symbols. As a result of the shape encoding applied to the bits, the resulting symbols may have unequal visitation probabilities, with some types of symbols having higher visitation probabilities than other types of symbols. At the optical receiver, blocks of FEC-encoded, shaped bit estimates may be recovered from received symbol estimates. After FEC decoding has been applied to the shaped bit estimates, shape decoding may be applied to produce blocks of corrected client bits.

Bits that have undergone shape encoding may be referred to as "shaped" or "unbalanced", in that the likelihood of a bit having a value of zero differs from the likelihood of a bit having a value of one. For example, an unbalanced bit may be more likely to have a value of zero than to have a value of one.

Bits that have not undergone shape encoding may be referred to as "unshaped" or "balanced", in that they are equally likely to have a value of zero and a value of one.

In U.S. Pat. No. 9,698,939, Oveis Gharan et al. describe techniques for PCS using algebraic encoding and tree encoding. In "Low-complexity shaping for enhanced nonlinearity tolerance", *Proceedings of ECOC* 2016, pp. 467-469, Cho et al. describe "cut-and-paste" or CAP encoding, which is another technique for PCS.

A constellation may consist of a finite number of distinct constellation points. The constellation points may be representatives of a finite set of distinct bit-sequences. A conventional labeling scheme may be a one-to-one correspondence that associates the set of constellation points with the set of bit-sequences, such that each constellation point may correspond to exactly one bit-sequence (or sequence of bits), and no two distinct constellation points may correspond to the same bit-sequence, and vice versa. The bit-sequence that correspond to a constellation point is called the label of the constellation point.

The choice of labeling scheme may cause different subsets of bits to have different BERs. For example, in the case of 4-PAM modulation with Gray labeling, the signal at a given point in time is expected to indicate one of four possible symbols or points in one dimension labelled as "00" "01" "11" "10" in an ascending order of amplitude. Each symbol represents two bits, where the bit in the rightmost position is the least significant bit (LSB) and the bit in the leftmost position is the most significant bit (MSB). When an optical transmitter uses 4-PAM modulation with Gray labeling to transmit an optical signal to an optical receiver, the received optical signal will be representative of a noisy version of one of those four constellation points, from which the two bits represented by that symbol may be decoded. Gray labeling ensures that adjacent symbols differ by only one bit. It should be apparent that the likelihood of a bit error (i.e., the BER) is inherently different for the MSB than it is for the LSB. That is, assuming a moderate noise level, with high probability, there is only one scenario in which the MSB might be decoded incorrectly: if the decoding incorrectly resulted in the "01" symbol instead of the "11" symbol (or vice versa). On the other hand, there are two scenarios in which the LSB might be decoded incorrectly: (1) if the decoding incorrectly resulted in the "00" symbol instead of the "01" symbol (or vice versa); or (2) if the decoding incorrectly resulted in the "11" symbol instead of the "10"

symbol (or vice versa). It follows that the BER of the LSB is twice the BER of the MSB. This is an example of a labeling scheme that inherently produces different subsets of bits having different BERs. In general, the different subsets may be dictated by the relative positions of the bits in the label. For example, bits in first position(s) in the label may have a different BER than bits in second position(s) in the label. The labeling scheme may be designed such that constellation points may be divided into subsets based on their labels. This is referred to as set partitioning. For example, constellation points with 0 in a first position of the label may belong to a different subset than constellation points with 1 in the first position of the label. A labeling scheme that uses set partitioning may result in disjoint subsets of constellation points, such that the union of the subsets contains all of the points in the constellation, and such that, within a particular subset, there is an increase in the minimum Euclidean distance as compared to the minimum Euclidean distance for the constellation as a whole. In other words, a labeling scheme that applies set partitioning may be understood as a labeling scheme in which each label may comprise a sub-sequence of bits located at one or more first positions. Under such a labeling scheme, constellation points with identical values in the sub-sequence of their labels form a subset of the constellation. Each subset has a minimum Euclidean distance greater than a minimum Euclidean distance of the whole constellation. According to some examples, the sub-sequence of bits may consist of a single bit located at a single first position, or a plurality of bits located at a respective plurality of first positions. According to some examples, the minimum Euclidean distance of the subset of constellation points may be significantly greater than the minimum Euclidean distance of the set of constellation points.

A variety of schemes for FEC encoding and decoding are known. The combination of a FEC encoding scheme and the corresponding FEC decoding scheme are herein referred to as a "FEC scheme." FEC schemes may provide better protection (i.e., better error detection and correction) by adding more redundancy. However, this is at the expense of a lower information rate R. Alternatively, a stronger FEC scheme that provides better protection may be obtained by increasing the block length, employing soft-decoding, and/or through spatial coupling. Circuitries to implement such stronger FEC schemes may take up more space, may be more expensive, and may produce more heat than circuitries to implement weaker FEC schemes. The choice of FEC schemes that are used for particular applications may be dictated by the specific requirements of those applications and by the quantities and classes or types of FEC schemes that are available.

In "Multilevel codes: theoretical concepts and practical design rules" (*IEEE Transactions on Information Theory*, Vol. 45, Issue 5, July 1999), Wachsmann et al. describe techniques for multilevel coding and multistage decoding. Multilevel coding attempts to exploit differences in BERs between bits. Decoded bits having different BERs may be sent to different classes of FEC schemes, where each class of FEC scheme is optimized for a particular BER or confidence value distribution, where the confidence value represents the confidence in the estimated value for a bit. An example of a confidence value is a log likelihood ratio. As an example, with layered encoding in a single real dimension, the points of a PAM constellation are labeled such that the information bits are grouped into a plurality of different layers in ascending order of effective bit-channel-capacity. The early layers with lower capacities are protected with stronger FEC schemes while the layers with higher capacities are protected with a higher-rate FEC scheme.

Chain decoding differs from multilevel coding in that it attempts to exploit a FEC-induced dependency between bits. U.S. Pat. No. 9,088,387 to Oveis Gharan et al. describes a technique for chain decoding, in which a sequence of tranches is decoded, and each tranche is sent through FEC decoding before using the error-free bits output by the FEC decoding to assist in the next tranche of decoding. The use of the error-free bits can significantly improve the BERs of the later bits. Rather than designing multiple classes of FEC schemes for different bits, as is done in multilevel coding, an advantageous version of chain decoding sends all of the bits through the same FEC scheme, but in a successive manner so that previously decoded bits may be used in the decoding of subsequent bits.

In "Bit-interleaved coded modulation" (*IEEE Transactions on Information Theory*, Vol. 44, Issue 3, May 1998), Caire et al. describe a FEC technique whereby multiple bits are decoded from each symbol, and those bits are treated as independent bits in the FEC scheme, rather than being treated symbol by symbol. Bit-interleaved coded modulation may use Gray coding in order to reduce the average number of bit errors caused by a symbol error. With Gray coding, nearest neighbour symbols differ by one bit, and so almost all symbol errors cause a single bit error. The number of bits that differ between two symbols is defined as the "Hamming distance" between those symbols.

U.S. Pat. No. 9,537,608 to Oveis Gharan et al. describes a FEC technique referred to as staggered parity, in which parity vectors are computed such that each parity vector spans a set of frames; a subset of bits of each frame is associated with parity bits in each parity vector; and a location of parity bits associated with one frame in one parity vector is different from that of parity bits associated with the frame in another parity vector.

In "Staircase Codes with 6% to 33% Overhead" (*Journal of Lightwave Technology*, Vol. 32, Issue 10, May 2014), Zhang and Kschischang describe an example of a high-rate FEC scheme.

In "Recent Progress in Forward Error Correction for Optical Communication Systems" (*IEICE transactions on communications*, Vol. 88, No 5, 2005), Mizuochi reviews the history of FEC in optical communications, including types of FEC based on concatenated codes. In "Experimental demonstration of concatenated LDPC and RS codes by FPGAs emulation" (*IEEE Photonics Technology Letters*, Vol. 21, No. 19, September 2009), Mizuochi et al. demonstrate experimentally a concatenated low-density parity check (LDPC) code and a Reed-Solomon (RS) code for optical channel error correction.

In "Low-complexity soft-decision LDGM-staircase FEC for high-bit-rate fiber-optic communication" (*Journal of Lightwave Technology*, Vol. 35, No. 18, September 2017), Zhang and Kschischang describe techniques to design concatenated low-density generator matrix (LDGM) codes and staircase codes, such that the overall complexity is minimized for a given channel condition. The LDGM code only performs error reduction, while the remaining errors are corrected by the staircase code.

In "Low-complexity concatenated LDPC-staircase codes" (*Journal of Lightwave Technology*, Vol. 36, No. 12, June 2018), Barakatain and Kschischang use an LDPC code to process only a portion of the bits, which further reduces the overall decoding complexity. However, detection is performed prior to FEC decoding, and the output of LDPC code is not used to improve the detection outcome.

The encoding of bits and/or the mapping of bits to symbols, may create a dependency between different subsets of bits. This dependency may be exploited during decoding in order to achieve a higher noise tolerance, or greater data capacity, or smaller sized communication system, or a lower power/heat implementation.

Where a dependency exists between bits, different subsets of bits may exhibit contrasting BERs. Contrast between the BERs of different subsets of bits may be achieved in a variety of ways. For example, as described previously, a labeling scheme that applies set partitioning may be used to achieve a dependency between different subsets of bits, thereby resulting in contrast between the BERs of the different subsets. According to another example, in U.S. Ser. No. 15/672,434 filed on Aug. 9, 2017, Oveis-Gharan et al. propose a technique referred to as "contrast coding" which may be used to tune the BERs experienced by different subsets of bits, relative to each other, in order to better match a plurality of FEC schemes, where the FEC schemes provide at least two distinct information rates.

In "Channel coding with multilevel/phase signals" (*IEEE Transactions on Information Theory*, Vol. IT-28, No. 1, January 1982), Ungerboeck describes a trellis coded modulation scheme, in which bits in a symbol label may be demapped and decoded successively, such that a bit in a label cleaned up by a FEC may be used to eliminate possible choices of constellation points, hence may assist the demapping of a next bit in the same symbol label. A technique called set partitioning is introduced, in which a constellation may be split into disjoint subsets of constellation points, such that all points in a subset have identical values in some positions in their labels.

Figure 2:
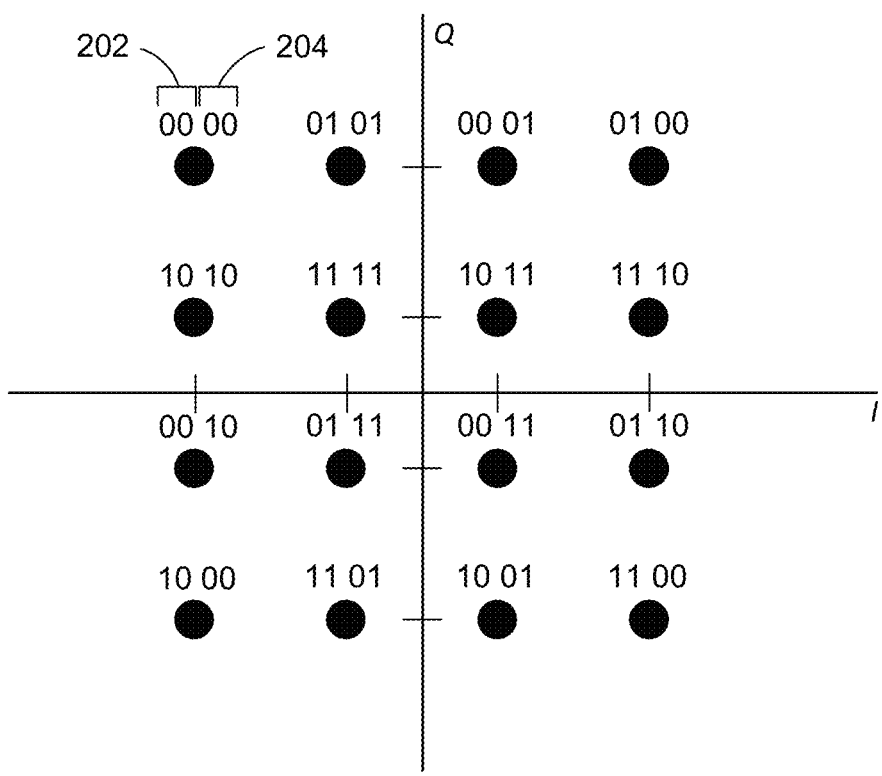
FIG. 2 illustrates a 16-QAM constellation diagram with a labeling scheme that applies set partitioning.

FIG. 2 illustrates a 16-QAM constellation diagram with labeling scheme that applies set partitioning.

In general, a plurality of constellation points may be labeled by a respective plurality of labels based on a labeling scheme. Each label may comprise a unique sequence of bits. In some examples, each unique sequence of bits may be divided into two or more sub-sequences. For example, each bit in a given label may belong to either a first sub-sequence or a second sub-sequence, based on the position of the bit within the label. In the example of FIG. 2, each one of the 16 constellation points is labeled by a label consisting of a unique sequence of four bits. One sub-sequence of bits consists of the two of the bits located at first positions 202 in the label, and another sub-sequence of bits consists of the two bits located at second positions 204 in the label. The bits located at the first positions 202 may hereinafter be referred to as "the first sub-sequence of bits", while the bits located at the second positions 204 may hereinafter be referred to as "the second sub-sequence of bits".

The labeling scheme used in FIG. 2 is such that the subset of four constellation points, for which the first sub-sequence of bits is identical, exhibits a minimum Euclidean distance that is greater than the minimum Euclidean distance of the entire set of 16 constellation points. For example, if the bits in the first positions 202 are known to be "01", then the four possible candidates for the four-bit symbol are: "0101", "0100", "0111", "0110". As is apparent in FIG. 2, the minimum Euclidean distance for this subset of four constellation points is twice as large as the minimum Euclidean distance for the entire set of 16 constellation points.

When a constellation is labeled using a labeling scheme that applies set partitioning, such as the labeling scheme illustrated in FIG. 2, information about the bits in certain positions in the label may assist in the decoding of the bits in other positions in the label. For example, upon obtaining substantially error-free knowledge of the bits in the first positions 202, this knowledge may be used for decoding estimates of the bits in the second positions 204, such that the estimates of the bits in the second positions 204 may exhibit a lower BER than initial estimates of the bits in the first positions 202.

According to some examples, unshaped bits may be mapped to the first positions 202, and shaped bits may be mapped to the second positions 204. As a result of the set partitioning used for the labeling scheme, substantially error-free knowledge of the unshaped bits may be used to achieve improved estimates of the shaped bits, such that the shaped bit estimates have a BER that is significantly lower than a BER of the unshaped bit estimates. This means that more protection (stronger FEC encoding) is needed for the unshaped bits, and less protection (weaker FEC encoding) is needed for the shaped bits.

FIG. 3 illustrates an example FEC encoding scheme 306. The FEC encoding scheme 306 may be implemented at an optical transmitter.

The FEC encoding scheme 306 comprises first FEC encoding 302 and second FEC encoding 304, where the first FEC encoding 302 and the second FEC encoding 304 provide unequal levels of protection to the bits they encode. The first FEC encoding 302 may have a higher rate, and therefore provide less protection, than the second FEC encoding 304. According to some examples, the first FEC encoding 302 may correspond to a hard decision FEC scheme or a soft decision FEC scheme, while the second FEC encoding 304 may correspond to a hard decision FEC scheme or a soft decision FEC scheme. In one example, the first FEC encoding 302 corresponds to a hard decision FEC scheme, and the second FEC encoding 304 corresponds to a soft decision FEC scheme. Given a fixed information rate R, a soft decision FEC scheme may provide better protection than a hard decision FEC scheme. When the information rate R is very high and the BER is very low, there may be less difference between the levels of protection provided by a hard decision FEC scheme and a soft decision FEC scheme. In this regime, power consumption may be reduced by using a hard decision FEC scheme for the second FEC encoding 304.

Shape encoding (not shown) may be applied to some portion of the client bits that are to be communicated by the optical transmitter to an optical receiver, thereby resulting in a set of shaped bits. The remaining client bits may form a set of unshaped bits. In FIG. 3, the set of shaped bits is denoted by 301, while the set of unshaped bits is denoted by 303. The shaped bits 301 and the unshaped bits 303 may ultimately be encoded and mapped to symbols in a manner that results in PCS. In another example (not shown), where PCS is not used, shape encoding may be omitted and all bits to be encoded by the FEC encoding scheme 306 may remain unshaped.

Where PCS is used, as shown in FIG. 3, the first FEC encoding 302 may be systematic and may be applied to the set of shaped bits 301, thereby resulting in a set of FEC-encoded bits comprising: a set of FEC-encoded shaped bits 305 and one or more first parity bits 309, where the first parity bits 309 are determined from the code used by the first FEC encoding 302. Because the first FEC encoding 302 is systematic, the FEC-encoded shaped bits 305 are identical to the set of shaped bits 301, which ensures that bits 305 remain shaped. Where PCS is not used, the first FEC encoding 302 may be non-systematic. In this case (not shown), the arrow 309 may be omitted, such that the arrow 305 represents the entire output of the first FEC encoding 302, including the first parity bits.

Where PCS is used, as shown in FIG. 3, the second FEC encoding 304 may be applied to the set of unshaped bits 303 and to the first parity bits 309 generated by the first FEC encoding 302, thereby resulting in a set of FEC-encoded bits 311 comprising: a set of encoded unshaped bits, encoded first parity bits, and one or more second parity bits, where the second parity bits are generated by the second FEC encoding 304. The second FEC encoding 304 may be systematic, such that the encoded unshaped bits are identical to the unshaped bits 303, and such that the encoded first parity bits are identical to the first parity bits 309. In other examples, the second FEC encoding 304 may be non-systematic. In general, parity bits, such as the first parity bits 309 and the second parity bits, have an equal probability of being zero and being one, and therefore considered unshaped. Since the set of FEC-encoded bits 311 comprises a combination of the set of unshaped bits 303, the unshaped first parity bits, and the unshaped second parity bits, the bits 311 may be referred to as the set of FEC-encoded unshaped bits 311.

The FEC-encoded shaped bits 305 and the FEC-encoded unshaped bits 311 may be mapped to symbols 313 according to a mapping 308. In the event that the mapping 308 involves a labeling scheme that uses set partitioning, there may be an inherent dependency between different bit positions in the symbols 313. That is, knowledge of a bit in a first position may improve the estimate of a bit in a second position. Thus, for example, the mapping 308 may map the FEC-encoded unshaped bits 311 to first positions in the symbols 313, and may map the FEC-encoded shaped bits 305 to second positions in the symbols 313. For example, with reference to FIG. 2, the FEC-encoded unshaped bits 311 may be mapped to the positions 202, while the FEC-encoded shaped bits 305 may be mapped to the positions 204.

The FEC encoding scheme 306 may create a dependency between the resulting sets of FEC-encoded bits 305, 311. As will be described with respect to FIG. 4, this dependency may be exploited during decoding at the optical receiver. The FEC encoding scheme 306 results in the FEC-encoded unshaped bits 311 being dependent on both the shaped bits 301 and the unshaped bits 303, while the FEC-encoded shaped bits 305 are only dependent on the shaped bits 301. The sets of FEC-encoded bits 305, 311 may be mapped to the symbols 313 according to the mapping 308. For example, the mapping 308 may map the FEC-encoded unshaped bits 311 to first positions in the symbols 313, and may map the FEC-encoded shaped bits 305 to second positions in the symbols 313.

The optical transmitter implementing the example FEC encoding scheme 306 may be operative to transmit an optical signal which is representative of the symbols 313.

FIG. 4 illustrates an example FEC decoding scheme 406 for use with the FEC encoding scheme 306 of FIG. 3. The FEC decoding scheme 406 may be implemented at an optical receiver.

The FEC decoding scheme 406 comprises first FEC decoding 402 and second FEC decoding 404 which correspond, respectively, to the first FEC encoding 302 and the second FEC encoding 304. According to some examples, the first FEC decoding 402 may correspond to a hard decision FEC scheme or a soft decision FEC scheme, while the second FEC decoding 404 may correspond to a hard decision FEC scheme or a soft decision FEC scheme. Together, the first FEC encoding 302 and first FEC decoding 402 may be referred to as "a first FEC scheme". Together, the second FEC encoding 304 and second FEC decoding 404 may be referred to as "a second FEC scheme".

The optical receiver implementing the example FEC decoding scheme 406 may be operative to receive an optical signal comprising a degraded version of an optical signal transmitted by an optical transmitter. The received optical signal may be representative of symbols 413, which may comprise noisy versions of the symbols 313 as described with respect to FIG. 3.

The symbols 413 may be demapped into bit estimates according to a demapping 408. The demapping 408 may involve applying an inverse of the scheme that was used in the mapping 308 performed at the optical transmitter. The demapping 408 may result in FEC-encoded shaped bit estimates 405 and FEC-encoded unshaped bit estimates 411.

The FEC-encoded unshaped bit estimates 411 may include estimates of the unshaped bits 303, as well as estimates of the first parity bits 309 and estimates of the second parity bits generated by the second FEC encoding 304.

The second FEC decoding 404 may be applied to the unshaped bit estimates 411, thereby resulting in corrected unshaped bits 403 and one or more corrected first parity bits 409.

The first FEC decoding 402 may be applied to the FEC-encoded shaped bit estimates 405 and to the corrected first parity bits 409, thereby resulting in corrected shaped bits 401. Shape decoding (not shown) may subsequently be applied to the corrected shaped bits 401. Together, the corrected shaped bits 401 and the corrected unshaped bits 403 may provide estimates of the original client bits encoded at the optical transmitter.

According to some examples, the second FEC decoding 404 may be sufficiently strong to take as input FEC-encoded unshaped bit estimates 411 having an average BER on the order of 8% or higher, and to output corrected unshaped bits 403 having an average BER of $1 \times 10^{-15}$ or lower.

As a result of the dependency achieved by the FEC encoding scheme 306, and optionally any dependency achieved by the labeling scheme used in the mapping 308, knowledge of the corrected unshaped bits 403 may be used to improve the FEC-encoded shaped bit estimates 405. In addition, the first parity bits 409 have already been corrected by the second FEC decoding 404. Accordingly, the FEC-encoded shaped bit estimates 405 and the corrected first parity bits 409 may, together, have an average BER on the order of $8 \times 10^{-4}$ or lower. Thus, it is possible to obtain the same average BER of $1 \times 10^{-15}$ or lower for the corrected shaped bits 401 as for the corrected unshaped bits 403, while using first FEC decoding 402 with less strength and power consumption than the second FEC decoding 404.

The architecture of the FEC scheme denoted by the FEC encoding 306 and the FEC decoding 406 presents several challenges. One challenge is that, in order for the second FEC decoding 404 to achieve an average output BER of $1 \times 10^{-15}$ or lower from input bits having an average BER of 8% or higher, a large amount of power may be consumed, and the complexity of the design may be significant. Another challenge is related to the high information rate of first FEC scheme (denoted by the first FEC encoding 302 and the first FEC decoding 402), which may be, for example, on the order of R=0.97 or higher, in order to achieve an average output BER of $1 \times 10^{-15}$ or lower from input bits having an average BER of $8 \times 10^{-4}$ or lower. Such a high information rate may make many known high-coding-gain low-power FEC schemes, such as staircase codes, less attractive due to the resulting extremely long block lengths. For example, the second FEC decoding 404 may have a block length on the order of ~3×10$^6$ bits.

As will be described further herein, these and other challenges may be addressed by concatenating the encoding of a first FEC scheme with the encoding of a second FEC scheme, instead of the parallel processing illustrated in FIGS. 3 and 4.

FIG. 5 illustrates an example FEC encoding scheme 506 in accordance with the technology disclosed herein. The FEC encoding scheme 506 may be implemented at an optical transmitter.

The FEC encoding scheme 506 comprises first FEC encoding 502 and second FEC encoding 504, where the second FEC encoding 504 is concatenated with the first FEC encoding 502. That is, the input to the second FEC encoding 504 comes entirely from the output of the first FEC encoding 502. The first FEC encoding 502 and the second FEC encoding 504 may provide equal or unequal levels of protection to the bits they encode. According to some examples, the first FEC encoding 502 may have a higher rate, and therefore provide less protection, than the second FEC encoding 504. According to some examples, the first FEC encoding 502 may correspond to a hard decision FEC scheme or a soft decision FEC scheme, while the second FEC encoding 504 may correspond to a hard decision FEC scheme or a soft decision FEC scheme. In one example, the first FEC encoding 502 corresponds to a hard decision FEC scheme, and the second FEC encoding 504 corresponds to a soft decision FEC scheme. According to some examples, the soft decision FEC scheme may be designed to accommodate a high input BER and to process as few bits as possible, so as to consume less power. In the case that the first FEC encoding 502 corresponds to a hard decision FEC scheme, examples of suitable codes may include convolutional codes, Bose-Chaudhuri-Hocquenghem (BCH) codes, product codes, staircase codes, and compression codes.

As previously described, shape encoding (not shown) may be applied to some portion of the client bits that are to be communicated by the optical transmitter to an optical receiver, thereby resulting in a set of shaped bits. The remaining client bits may form a set of unshaped bits. In FIG. 5, the set of shaped bits is denoted by 501, while the set of unshaped bits is denoted by 503. Together, the shaped bits 501 and unshaped bits 503 may be referred to as "first bits", where the unshaped bits 503 may be referred to as a "subset of the first bits". The shaped bits 501 and the unshaped bits 503 may ultimately be encoded and mapped to symbols in a manner that results in PCS. In another example (not shown), where PCS is not used, shape encoding may be omitted and all bits to be encoded by the FEC encoding scheme 506 may remain unshaped.

Where PCS is used, as shown in FIG. 5, the first FEC encoding 502 may be systematic and may be applied to both the shaped bits 501 and to the unshaped bits 503, thereby resulting in a set of FEC-encoded bits which may comprise: a set of FEC-encoded shaped bits 505, a set of FEC-encoded unshaped bits 507, and one or more first parity bits 509, where the first parity bits 509 are determined from the code used by the first FEC encoding 502. Because the first FEC encoding 502 is systematic, the FEC-encoded shaped bits 505 are identical to the shaped bits 501, and the FEC-encoded unshaped bits 507 are identical to the unshaped bits 503. The FEC-encoded shaped bits 505 may be referred to as "second bits". Together, the FEC-encoded unshaped bits 507 and the first parity bits 509 may be referred to as "third bits". Where the first FEC encoding 502 corresponds to a compression FEC scheme, the first parity bits 509 may comprise one or more nubs. Where PCS is not used, the first FEC encoding 502 may be non-systematic. In this case (not shown), the FEC-encoded unshaped bits 507 may not be identical to the unshaped bits 503. However, the FEC-encoded shaped bits 505 are still required to be identical to the shaped bits 501.

Where PCS is used, as shown in FIG. 5, the second FEC encoding 504 may be applied to the FEC-encoded unshaped bits 507 and to the first parity bits 509, thereby resulting in a set of FEC-encoded bits 511 comprising: a set of encoded unshaped bits, encoded first parity bits, and one or more second parity bits, where the second parity bits are generated by the second FEC encoding 504. The second FEC encoding 504 may be systematic, such that the encoded unshaped bits are identical to the unshaped bits 503, and such that the encoded first parity bits are identical to the first parity bits 509. In other examples, the second FEC encoding 504 may be non-systematic. Parity bits, such as the first parity bits 509, have an equal probability of being zero and being one, so they are considered unshaped. Since the set of FEC-encoded bits 511 comprises a combination of the set of unshaped bits 503, the unshaped first parity bits 509, and the unshaped second parity bits, the bits 511 may be referred to as the set of FEC-encoded unshaped bits 511. The FEC-encoded unshaped bits 511 may also be referred to as "fourth bits".

The fact that the second FEC encoding 504 is concatenated with the first FEC encoding 502 may ultimately provide the shaped bits 501 and the unshaped bits 503 with different levels of protection.

The FEC-encoded shaped bits 505 (the second bits) and the FEC-encoded unshaped bits 511 (the fourth bits) may be mapped to symbols 513 according to a mapping 508. Where the mapping 508 involves a labeling scheme that uses set partitioning, there may be an inherent dependency between different bit positions in the symbols 513. That is, knowledge of a bit in a first position may improve the estimate of a bit in a second position. Thus, for example, the mapping 508 may map the FEC-encoded unshaped bits 511 to first positions in the symbols 513, and may map the FEC-encoded shaped bits 505 to second positions in the symbols 513. For example, with reference to FIG. 2, the FEC-encoded unshaped bits 511 may be mapped to the positions 202, while the FEC-encoded shaped bits 505 may be mapped to the positions 204. According to some examples, the second bits may be encoded on a different wavelength or a different FDM stream than the fourth bits.

The FEC encoding scheme 506 may create a dependency between the resulting sets of FEC-encoded bits 505, 511. As will be described with respect to FIG. 6, this dependency may be exploited during decoding at the optical receiver. The FEC encoding scheme 506 results in the FEC-encoded unshaped bits 511 being dependent on both the shaped bits 501 and the unshaped bits 503, while the FEC-encoded shaped bits 505 are only dependent on the shaped bits 501. The sets of FEC-encoded bits 505, 511 may be mapped to the symbols 513 according to the mapping 508. For example, the mapping 508 may map the FEC-encoded unshaped bits 511 to first positions in the symbols 513, and may map the FEC-encoded shaped bits 505 to second positions in the symbols 513.

FIG. 6 illustrates an example FEC decoding scheme 606 for use with the FEC encoding scheme 506 of FIG. 5. The FEC decoding scheme 606 may be implemented at an optical receiver.

The FEC decoding scheme 606 comprises first FEC decoding 602 and second FEC decoding 604 which correspond, respectively, to the first FEC encoding 502 and the second FEC encoding 504. According to some examples, the first FEC decoding 602 may correspond to a hard decision FEC scheme or a soft decision FEC scheme, while the second FEC decoding 604 may correspond to a hard decision FEC scheme or a soft decision FEC scheme. Together, the first FEC encoding 502 and first FEC decoding 602 may be referred to as "a first FEC scheme". Together, the second FEC encoding 504 and second FEC decoding 604 may be referred to as "a second FEC scheme".

The optical receiver implementing the example FEC decoding scheme 606 may be operative to receive an optical signal comprising a degraded version of an optical signal transmitted by an optical transmitter. The received optical signal may be representative of symbol estimates 613, which may comprise noisy versions of the symbols 513 as described with respect to FIG. 5.

The symbol estimates 613 may be demapped into bit estimates according to a demapping 608. The demapping 608 may involve applying an inverse of the code that was used in the mapping 508 performed at the optical transmitter. The demapping 608 may result in FEC-encoded shaped bit estimates 605 and FEC-encoded unshaped bit estimates 611. The FEC-encoded unshaped bit estimates 611 may be referred to as "first bit estimates", while the FEC-encoded shaped bit estimates 605 may be referred to as "second bit estimates". According to some examples, the values of the FEC-encoded shaped bit estimates 605 may be conditioned on values of the FEC-encoded unshaped bit estimates 611. That is, for each hypothetical set of values of the FEC-encoded unshaped bit estimates 611, there may be a corresponding set of values of the FEC-encoded shaped bit estimates 605. In this case, the FEC-encoded shaped bit estimates 605 may be conditionally decoded, and the appropriate values may be selected once the values of the FEC-encoded unshaped bit estimates 611 are known.

In the case where the second FEC encoding 504 is systematic, the FEC-encoded unshaped bit estimates 611 may include estimates of the unshaped bits 507, as well as estimates of the first parity bits 509 and estimates of the second parity bits generated by the second FEC encoding 504. In the case where the first FEC encoding 502 corresponds to a compression FEC scheme, the estimates of the first parity bits 509 may comprise estimates of one or more nubs.

The second FEC decoding 604 may be applied to the unshaped bit estimates 611 (the second bit estimates), thereby resulting in partially-corrected unshaped bits 607 and one or more partially-corrected first parity bits 609. Together, the partially-corrected unshaped bits 607 and one or more partially-corrected first parity bits 609 may be referred to as "third bit estimates". According to some examples, the third bit estimates output by the second FEC decoding 604 may be substantially error-free.

The first FEC decoding 602 may be applied to the FEC-encoded shaped bit estimates 605 (the first bit estimates) and to the partially-corrected unshaped bits 607 and the partially-corrected first parity bits 609 (together, the third bit estimates), thereby resulting in corrected unshaped bits 603 and corrected shaped bits 601. Together, the corrected unshaped bits 603 and corrected shaped bits 601 may be referred to as "fourth bit estimates". Shape decoding (not shown) may subsequently be applied to the corrected shaped bits 601. The fourth bit estimates may provide estimates of the original client bits encoded at the optical transmitter.

According to some examples, the second FEC scheme may be spatially coupled with the bits in the first FEC scheme, in the sense that some bits encoded by the second FEC encoding 504 come from different code blocks generated by the first FEC encoding 502. According to some examples, the mapping 508 may be spatially coupled with the first and second FEC schemes, in the sense that, in the label of a given symbol, the first bit positions and the second bit positions are parts of two or more different code blocks generated by the first FEC encoding or the second FEC encoding.

The first FEC decoding 602 may be applied jointly to the FEC-encoded shaped bit estimates 605 (the second bit estimates) and to the partially-corrected unshaped bits 607 and partially-corrected first parity bits 609 (the third bit estimates), for example, by using chain decoding as described by Oveis Gharan et al. in U.S. Pat. No. 9,088,387. Alternatively, the first FEC decoding 602 may be applied in parallel or separately to the FEC-encoded shaped bit estimates 605 (the second bit estimates) and to the partially-corrected unshaped bits 607 and partially-corrected first parity bits 609 (the third bit estimates).

According to some examples, there may be iterations between the second FEC decoding 604 and the first FEC decoding 602. For example, the iterations may comprise (1) applying the second FEC decoding 604 to the FEC-encoded unshaped bit estimates 611 to generate the partially-corrected unshaped bits 607 and partially-corrected first parity bits 609; (2) applying the first FEC decoding 602 to the FEC-encoded shaped bit estimates 605, the partially-corrected unshaped bits 607, and the partially-corrected first parity bits 609 to generate the corrected shaped bits 601 and the corrected unshaped bits 603; (3) applying the first FEC encoding 502 to the corrected shaped bits 601 and the corrected unshaped bits 603 to generate updated versions of the FEC-encoded shaped bit estimates 605, the partially-corrected unshaped bits 607, and the partially-corrected first parity bits 609; (4) applying the second FEC encoding 504 to the partially-corrected unshaped bits 607 and the partially-corrected first parity bits 609 to generate an updated version of the FEC-encoded unshaped bit estimates 611; (5) using the updated versions of the FEC-encoded shaped bit estimates 605 to generate an additional updated version of the FEC-encoded unshaped bit estimates 611, since bit estimates 611 and bit estimates 605 correspond to different positions in symbol labels; and (6) repeating (1) to (5) until there are no more updates to the corrected shaped bits 601 and the corrected unshaped bits 603.

There are several different options for demapping the FEC-encoded shaped bit estimates 605 from the symbol estimates 613. In one example, the FEC-encoded shaped bit estimates 605 and the FEC-encoded unshaped bit estimates 611 may be demapped from the symbol estimates 613 at substantially the same time. This may result in the FEC-encoded shaped bit estimates 605 having a high BER, since their demapping will not benefit from knowledge of the partially-corrected unshaped bits 607 and the partially-corrected first parity bits 609, which have yet to be determined. In another example, the FEC-encoded shaped bit estimates 605 may be demapped after the partially-corrected unshaped bits 607 and the partially-corrected first parity bits 609 have been generated. This is referred to as speculative decoding, and may result in the FEC-encoded shaped bit estimates 605 having a lower BER, since their demapping will benefit from knowledge of the partially-corrected unshaped bits 607 and the partially-corrected first parity bits 609. In yet another example, the FEC-encoded shaped bit estimates 605 may be demapped after the corrected unshaped bits 603 are determined. This may result in the FEC-encoded shaped bit estimates 605 having an even lower BER, since their demapping will benefit from knowledge of the corrected unshaped bits 603, which are substantially error-free. However, in order to make this manner of demapping possible, for a given symbol 513, the first bits (comprising the shaped bits 501 and unshaped bits 503) would need to be distributed in a different FEC block than the second bits (comprising the FEC-encoded shaped bits 505).

According to some examples, the second FEC decoding 604 may be sufficiently strong to take as input FEC-encoded unshaped bit estimates 611 having an average BER on the order of 8% or higher, and to output partially-corrected unshaped bits 607 and 609 having an average BER on the order of $8 \times 10^{-3}$. This is in contrast to the second FEC decoding 404, which is sufficiently strong to take the same input BER of 8% or higher, and to output bits having an average BER of $1 \times 10^{-15}$ or lower. The increase of the output BER threshold for the second FEC decoding, from $1 \times 10^{-15}$ to $8 \times 10^{-3}$ may allow for the relaxation of design constraints on the second FEC scheme, and may also reduce power consumption.

The first FEC decoding 602 is used to correct errors in the FEC-encoded shaped bit estimates 605 and also residual errors in the partially-corrected unshaped bits 607 and 609. This is in contrast to the first FEC decoding 404, which is used to correct errors in the FEC-encoded shaped bit estimates 605 alone. Accordingly, the average BER of the bits that are input to the first FEC decoding 602 may be higher than the average BER of the bits that input to the first FEC decoding 402. For example, instead of an input BER on the order of $8 \times 10^{-4}$, the input BER for the first FEC decoding 602 may be on the order of $\sim 4 \times 10^{-3}$. This increase in BER may enable the use of a wider range of high-coding-gain low-power hard decision FEC schemes. In one example, the first FEC decoding 602 may comprise a staircase code. Staircase codes are known to have excellent performance and low power consumption. In another example, the first FEC decoding 602 corresponds to a compression FEC scheme.

There is no known analytical method to evaluate the performance of a soft FEC scheme, and due to the limited computational resource, it is extremely difficult to verify the performance of a soft FEC scheme when the output BER is on the order of $1 \times 10^{-15}$. The FEC scheme defined by the FEC encoding scheme 506 and the FEC decoding scheme 606 may offer simplified verification.

The FEC scheme defined by the FEC encoding scheme 506 and the FEC decoding scheme 606 may only require performance verification when the output BER is on the order of $8 \times 10^{-3}$. To get the same level of confidence, this may reduce the required number of testing soft FEC frames by 12 orders of magnitude, thereby making it possible to use simulation results only, rather than curve fitting, to verify the performance of the soft FEC scheme.

The average BER of the partially-corrected unshaped bits 607 output by the second FEC decoding 604 may be adjusted based on the design of the first FEC decoding 602. According to one example, the FEC scheme defined by the second FEC encoding 504 and the second FEC decoding 604 may comprise an LDGM code.

In an alternative to the schematics illustrated in FIGS. 5 and 6, the second FEC encoding 504 may be applied to only a subset of the third bits output by the first FEC encoding 502. For example, the second FEC encoding 504 may be applied to only the first parity bits 509. In this case, the first bit estimates undergoing the second FEC decoding 604 at the optical receiver would include only estimates of the first parity bits 509 and estimates of the second parity bits generated by the second FEC encoding 504. The first bit estimates would not include any estimates of the unshaped bits 503, since the unshaped bits 503 would not have undergone the second FEC encoding 504 at the optical transmitter.

As previously noted, the first FEC scheme and the second FEC scheme may each be systematic or non-systematic. However, there may be advantages when both schemes are systematic. For example, when the demapping of the FEC-encoded shaped bit estimates 605 occurs after the determination of the partially-corrected unshaped bits 607, the use of a non-systematic second FEC scheme would require passing the partially-corrected unshaped bits 607 and the partially-corrected first parity bits 609 through the second FEC encoding 504 to obtain updated FEC-encoded unshaped bit estimates 611, and then performing demapping of the FEC-encoded shaped bit estimates 605. If the second FEC scheme is systematic, only estimates of the second parity bits in bits 611 need to be updated by passing bits 607 and bits 609 through the parity portion of the second FEC encoding 504. Alternatively, one may choose not to update the second parity bit portion in 611. Either way, the use of a systematic second FEC scheme leads to reduced decoding complexity. A similar advantage may be seen if the first FEC scheme is also systematic, when the optional iterations between the first and second FEC schemes are enabled.

In general, the information rate of the second FEC scheme need not be lower than the information rate of the first FEC scheme. In practice, performance gain is expected to be more significant when there is a greater difference between the BER of the FEC-encoded shaped bit estimates 605 and the BER of the FEC-encoded unshaped bit estimates 611. When there is a large difference between these two BERs, optimization of the FEC scheme defined by the FEC encoding scheme 506 and the FEC decoding scheme 606 may result in the second FEC scheme (defined by the second FEC encoding 504 and the second FEC decoding 604) having a much lower information rate than the first FEC scheme (defined by the first FEC encoding 502 and the first FEC decoding 602).

Figure 7:
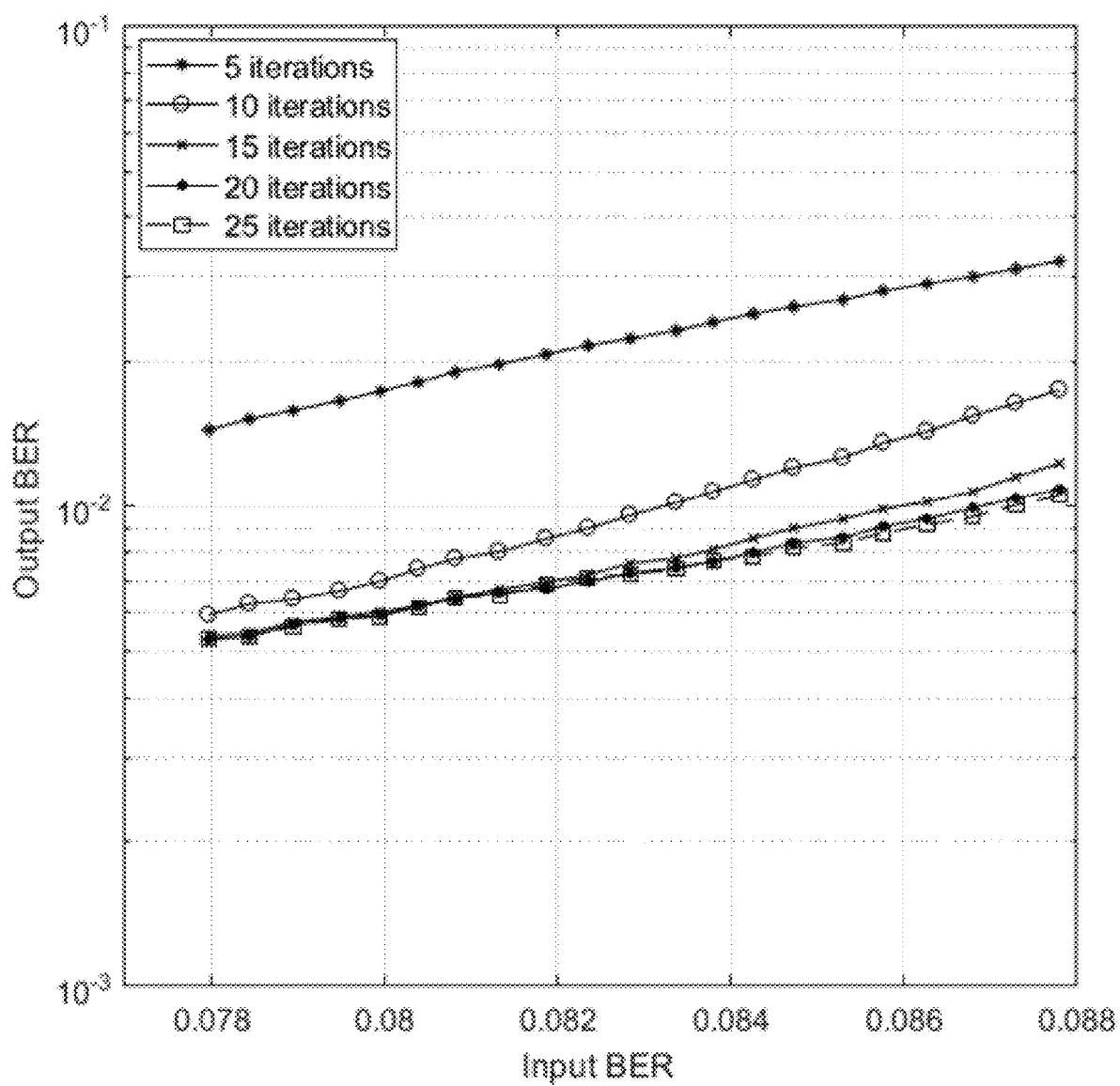
FIG. 7 is a plot of the performance of a low-density generator matrix (LDGM) code.

As previously noted, the second FEC scheme (defined by the second FEC encoding 504 and the second FEC decoding 604) may comprise an LDGM code. FIG. 7 is a plot showing the performance of an LDGM code over different numbers of iterations. In this example, the LDGM code uses a relatively short block length of 8000 and an information rate of $R = 2/3$. As is apparent from the plot, 15 iterations may be sufficient to decrease the BER from approximately 8.4% down to 0.8%. The relatively short block length and the limited number of iterations may allow for decoding that is significantly less complex than the decoding used for other soft decision FEC schemes which are designed to reduce the BER down to $1 \times 10^{-15}$ or lower. Accordingly, the use of an LDGM code for the second FEC scheme (defined by the second FEC encoding 504 and the second FEC decoding 604) may be of interest for reducing power consumption.

Figure 8:
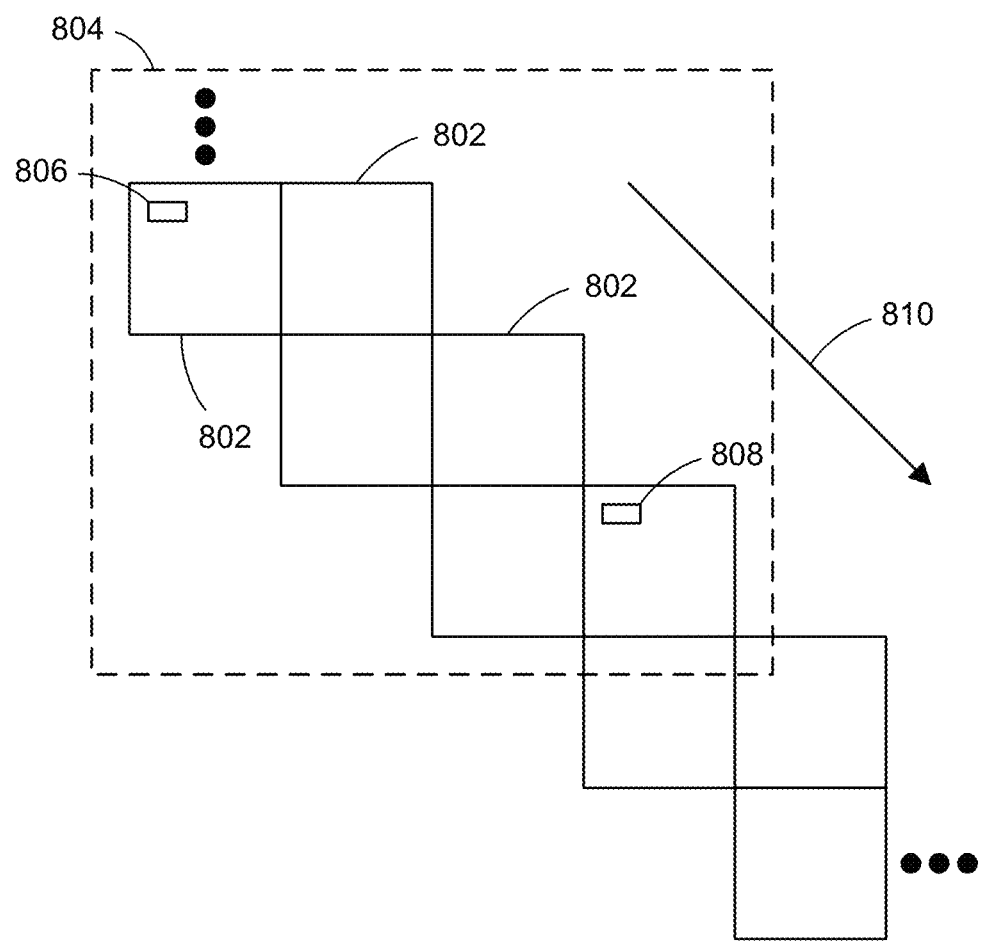
FIG. 8 is a schematic illustrating an example implementation of staircase decoding in accordance with some examples of the technology disclosed herein.

As previously noted, the first FEC decoding 602 may comprise a staircase code. As illustrated in the schematic of FIG. 8, staircase decoding may be implemented by iteratively decoding a series of blocks 802 of input bits, where each block 802 comprises a mixture of the partially-corrected unshaped bits 607 and the FEC-encoded shaped bit estimates 605, and the partially-corrected first parity bits 609.

The decoding of the blocks 802 is based on the position of a sliding window 804, which moves along a general direction denoted by arrow 810. In a given decoding iteration inside the sliding window, the leftmost blocks 802 are processed earlier than the rightmost blocks 802 in FIG. 8.

For a given symbol, the partially-corrected unshaped bits 607 and the FEC-encoded shaped bit estimates 605 may be separated into different blocks, and the blocks may or may not coexist in the sliding window 804. For example, the partially-corrected unshaped bits 607 of the $i^{th}$ symbol may be located at position 806, while the FEC-encoded shaped bit estimates 605 of the $i^{th}$ symbol may be located at position 808. By the time the bit estimates at position 808 are processed by the FEC decoder, the bit estimates located at position 806 have already undergone at least one decoding iteration. Accordingly, the BER of the partially-corrected unshaped bits 607 (located at position 806) may be sufficiently low to obtain an initial estimate of the corresponding FEC-encoded shaped bit estimates 605 (located at position 808, according to the demapping 608). By allowing the partially-corrected unshaped bits 607 and the FEC-encoded shaped bit estimates 605 to co-exist within the sliding window 804, it may be possible for information to flow from the FEC-encoded shaped bit estimates 605 to the partially-corrected unshaped bits 607. That is, as described previously, an iteration may be performed in which the FEC-encoded shaped bit estimates 605 are used to obtain revised estimates of the partially-corrected unshaped bits 607.

A staircase code having an information rate on the order of R=0.941 may be used to reduce the overall BER to less than $1 \times 10^{-15}$. Where the first FEC decoding 602 is implemented using a staircase code, if any of the shaped bits being decoded are flipped, there may be an option of flipping some of the unshaped bits associated with the same symbols as well, provided that they are still in the sliding window 804.

Figure 9:
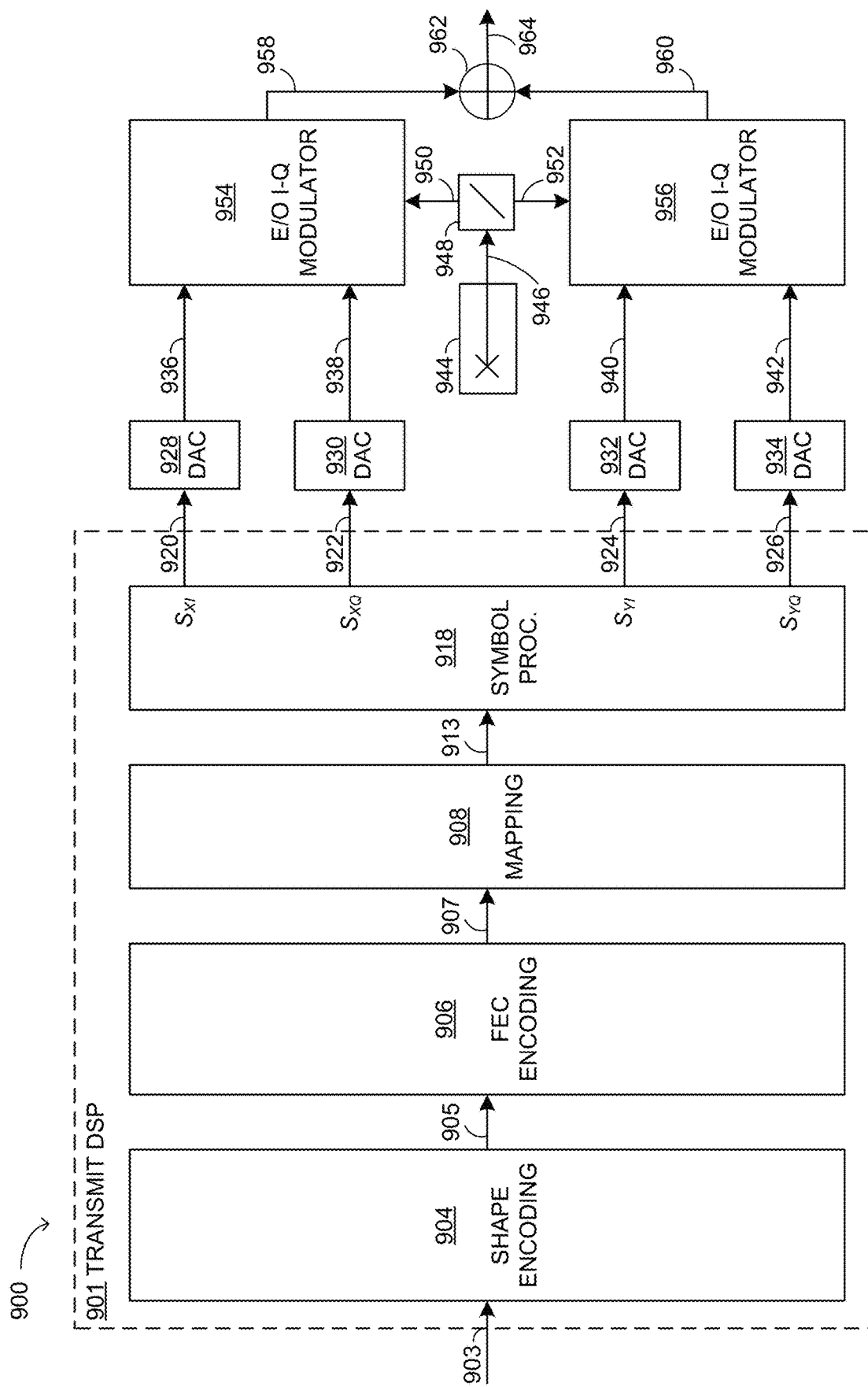
FIG. 9 illustrates an example optical transmitter in accordance with the technology disclosed herein.

FIG. 9 is a block diagram illustration of an example transmitter section 900 of an optical transceiver ("optical transmitter 900"), in accordance with examples of the technology disclosed herein.

The optical transmitter 900 is operative to transmit an optical signal 964 which is representative of client bits 903. The optical transmitter 900 employs polarization-division multiplexing (PDM). In other examples (not shown), generation of the optical signal may involve alternative techniques, such as single polarization modulation, modulation of an unpolarized carrier, mode-division multiplexing, spatial-division multiplexing, Stokes-space modulation, polarization balanced modulation, and the like. A laser 944 is operative to generate a continuous wave (CW) optical carrier 946. A polarizing beam splitter 948 is operative to split the CW optical carrier 946 into orthogonally-polarized components 950, 952 that are modulated by respective electrical-to-optical modulators 954, 956 to produce modulated polarized optical signals 958, 960 that are combined by a beam combiner 962, thus yielding an optical signal 964.

The optical transmitter 900 comprises a transmit digital signal processor (DSP) 901. The transmit DSP 901 may be operative to apply symbol processing 918 to symbols 913, for example, by performing one or more of pulse shaping, chromatic dispersion precompensation, and distortion precompensation on the symbols. The symbol processing 918 may include the application of one or more filters, which may involve the application of one or more Fast Fourier Transforms (FFTs) and one or more corresponding inverse FFTs (IFFTs).

Based on the symbols 913 and a selected modulation scheme, the transmit DSP 901 may be operative to generate four digital drive signals at each particular time interval, t, corresponding to the four dimensions XI, XQ, YI, YQ. For example, digital drive signals 920, 922 may correspond to the I and Q components, respectively, of the X polarization, while digital drive signals 924, 926 may correspond to the I and Q components, respectively, of the Y polarization. According to this example, at the time interval, t, the digital drive signals 920, 922 may be denoted $S_{XI}(t)$, $S_{XQ}(t)$, respectively, while digital drive signals 924, 926 may be denoted $S_{YI}(t)$, $S_{YQ}(t)$, respectively.

The optical transmitter 900 also comprises a plurality of digital-to-analog converters (DACs) 928, 930, 932, 934 which may respectively be used to convert the digital drive signals 920, 922, 924, 926 into respective analog drive signals. For example, the digital drive signals 920, 922 may be input to DACs 928, 930, respectively, to produce I and Q analog drive signals 936, 938. The digital drive signals 924, 926 may be input to DACs 932, 934, respectively, to produce I and Q analog drive signals 940, 942. The analog drive signals 936, 938 are used to drive the electrical-to-optical modulator 954, and the analog drive signals 940, 942 are used to drive the electrical-to-optical modulator 956, which ultimately results in the optical signal 964.

The transmit DSP 901 may be operative to apply shape encoding 904, FEC encoding 906, and mapping 908 in order to generate the symbols 913 from the client bits 903.

The shape encoding 904 may be implemented using tree encoding or algebraic encoding. The shape encoding 904 may be applied to only a subset or portion of the client bits 903. Accordingly, for simplicity, the output bits 905 of the shape encoding 904 may be understood as comprising both shaped bits and unshaped bits. For example, the output 905 may comprise the shaped bits 501 and the unshaped bits 503 as described with respect to FIG. 5.

The FEC encoding 906 may comprise the FEC encoding scheme 506 as described with respect to FIG. 5. That is, the FEC encoding 906 may comprise first FEC encoding which is applied to the bits 905 (which include shaped bits and unshaped bits), and second FEC encoding which is applied to the unshaped bits and to the parity bits generated by the first FEC encoding. The output of the FEC encoding 906, denoted by 907, may comprise FEC-encoded shaped bits and FEC-encoded unshaped bits, such as the bits denoted by 505 and 511, respectively in FIG. 5.

The mapping 908 may comprise the mapping 508 as described with respect to FIG. 5. That is, the mapping 908 may map a first set of FEC-encoded bits 907 to first positions in the symbols 913, and may map a second set of FEC-encoded bits 907 to second positions in the symbols 913. For example, the first set of the FEC-encoded bits 907 may comprise the FEC-encoded unshaped bits 511, and may be mapped by the mapping 908 to first positions in the symbols, such as the positions 202 in FIG. 2, while the second set of the FEC-encoded bits 907 may comprise the FEC-encoded shaped bits 505, and may be mapped by the mapping 908 to second positions in the symbols, such as the positions 204 in FIG. 2.

According to some examples, the transmit DSP 901 may implement one or more of the shape encoding 904, the FEC encoding 906, the mapping 908, and the symbol processing 918 by executing computer-executable instructions or code stored in a memory of the optical transmitter 900.

The optical transmitter 900 may comprise additional components that are not described in this document.

Figure 10:
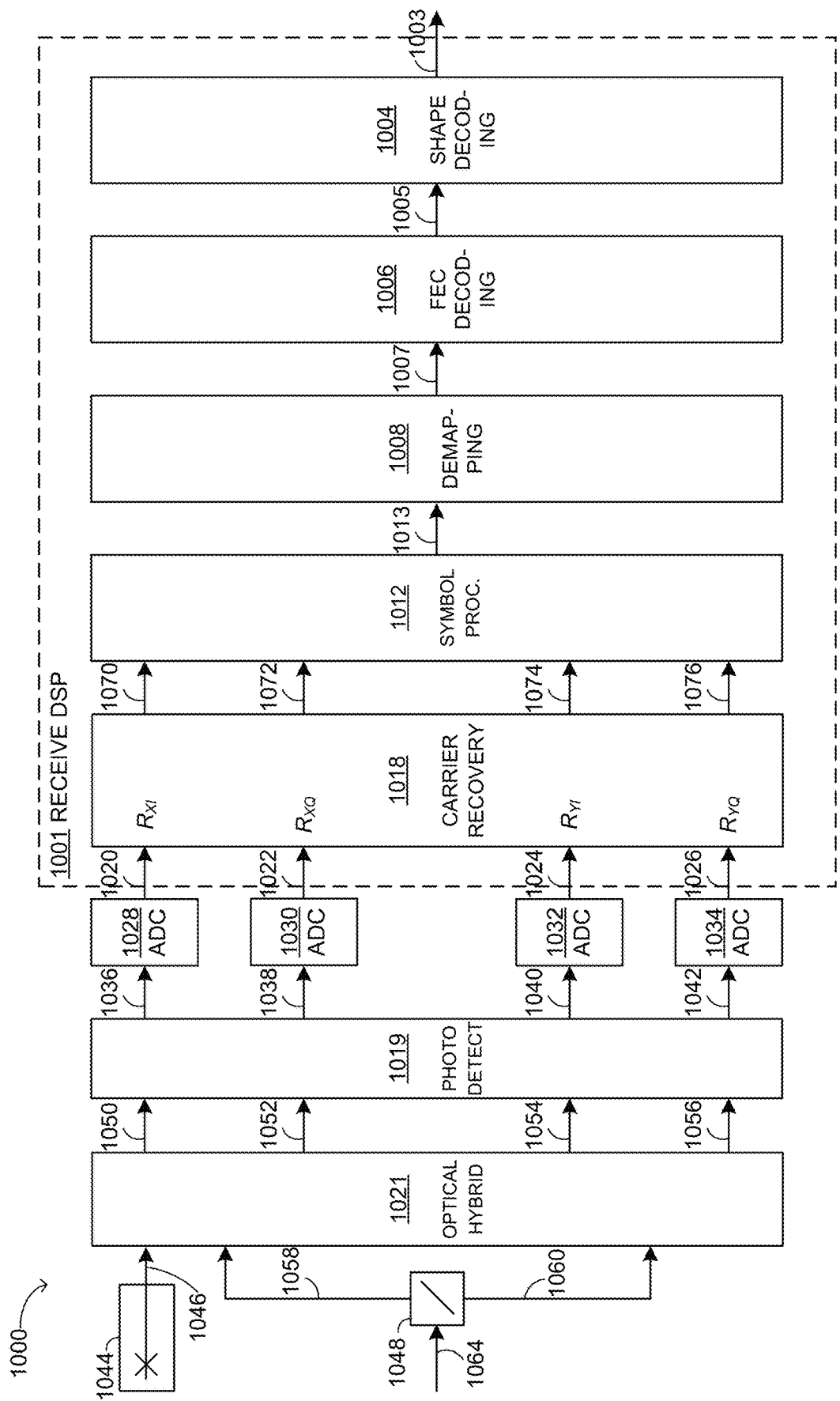
FIG. 10 illustrates an example optical receiver in accordance with the technology disclosed herein.

FIG. 10 is a block diagram illustration of an example optical receiver section 1000 of an optical transceiver ("optical receiver 1000"), in accordance with examples of the technology disclosed herein.

The optical receiver 1000 may be operative to recover corrected bits 1003 from a received optical signal 1064, where the bits 1003 may comprise estimates of client bits intended for communication by an optical transmitter to the optical receiver 1000 over an optical communication link. The received optical signal 1064 may comprise a degraded version of the optical signal 964 generated by the optical transmitter 900, where the degradations in the received optical signal 1064 may have been caused, for example, by one or more of noise, nonlinear effects, PDL or PDG, and imperfections in analog signal processing performed at the optical transmitter 900. A polarizing beam splitter 1048 is operative to split the received optical signal 1064 into orthogonally-polarized components 1058, 1060. An optical hybrid 1021 is operative to process the components 1058, 1060 with respect to an optical signal 1046 produced by a laser 1044. Photodetectors 1019 are operative to convert the outputs 1050, 1052, 1054, 1056 of the optical hybrid 1021 to received analog electrical signals 1036, 1038, 1040, 1042, respectively. The four received analog signals correspond to the four dimensions XI, XQ, YI, YQ at a particular time interval, t.

The optical receiver 1000 comprises analog-to-digital converters (ADCs) 1028, 1030, 1032, 1034 which are operative to sample the received analog signals 1036, 1038, 1040, 1042, respectively, and to generate received digital signals 1020, 1022, 1024, 1026, respectively. In one example, the received analog signals 1036, 1038 may correspond to the I and Q components, respectively, of the X polarization, while the received analog signals 1040, 1042 may correspond to the I and Q components, respectively, of the Y polarization. According to this example, at the time interval, t, the received digital signals 1020, 1022 may be denoted $R_{XI}(t)$, $R_{XQ}(t)$ respectively, while the received digital signals 1024, 1026 may be denoted $R_{YI}(t)$, $R_{YQ}(t)$, respectively.

The optical receiver 1000 also comprises a receive DSP 1001.

The receive DSP 1001 may be operative to apply a carrier recovery process 1018 to the digital signals 1020, 1022, 1024, 1026 in order to derive respective digital signals 1070, 1072, 1074, 1076, which are representative of symbols.

The receive DSP 1001 may be operative to apply symbol processing 1012 to the digital signals 1070, 1072, 1074, 1076 to derive symbol estimates 1013 for the two orthogonal polarizations. For example, the symbol processing 1012 may include the application of one or more filters to the digital signals 1070, 1072, 1074, 1076, which may involve the application of one or more FFTs and one or more corresponding IFFTs. The symbol processing 1012 may also include, for example, chromatic dispersion post-compensation, and distortion post-compensation. The symbol estimates 1013 resulting from the symbol processing 1012 are estimates of the symbols 913 that were generated by the mapping 908 performed at the optical transmitter 900.

The receive DSP 1001 may be operative to apply demapping 1008 to the symbol estimates 1013 in order to derive bit estimates 1007. The bit estimates 1007 may correspond to estimates of the bits 907. A bit estimate may comprise a binary value, or may comprise a confidence value, such as log-likelihood ratio. In the case of a binary-valued variable (i.e., a bit), its log-likelihood ratio (LLR) is defined as the logarithm of the ratio of the probability of the bit being equal to one to the probability of the bit being equal to zero. For example, for a bit b, $$LLR(b) = \log \frac{P(b=1)}{P(b=0)},$$

where P denotes probability. For non-binary-valued variables, such as a set of integers, other metrics could be used, such as the logarithm of the probability of a given integer value divided by the sum of the probabilities of the other possible integer values, for example.

The receive DSP 1001 may be operative to apply FEC decoding 1006 to the bit estimates 1007 to recover the corrected bits 1005. The FEC decoding 1006 may comprise the FEC decoding scheme 606 as described with respect to FIG. 6. That is, where the bit estimates 1007 comprise the FEC-encoded shaped bit estimates 605 and the FEC-encoded unshaped bit estimates 611, the FEC decoding 1006 may comprise the second FEC decoding 604 which is applied to only the FEC-encoded unshaped bit estimates 611, and the first FEC decoding 602 which is applied to the FEC-encoded shaped bit estimates 605 and to the partially-corrected unshaped bits 607 and the partially-corrected first parity bits 609 output by the second FEC decoding 604. The output of the FEC decoding 1006, denoted by 1005, may comprise corrected unshaped bits and corrected shaped bits, such as the bits denoted by 603 and 601, respectively, in FIG. 6.

The receive DSP 1001 may be operative to apply shape decoding 1004 to the bits 1005 in order to recover the corrected bits 1003. The shape decoding 1004 may be implemented by applying the inverse of the shape encoding 904, and the bits 1003 may comprise estimates of the client bits 903.

According to some examples, the receive DSP 1001 may implement one or more of the carrier recovery 1018, the symbol processing 1012, the demapping 1008, the FEC decoding 1006, and the shape decoding 1004 by executing computer-executable instructions or code stored in a memory of the optical receiver 1000.

The optical receiver 1000 may comprise additional components that are not described in this document.

Figure 11:
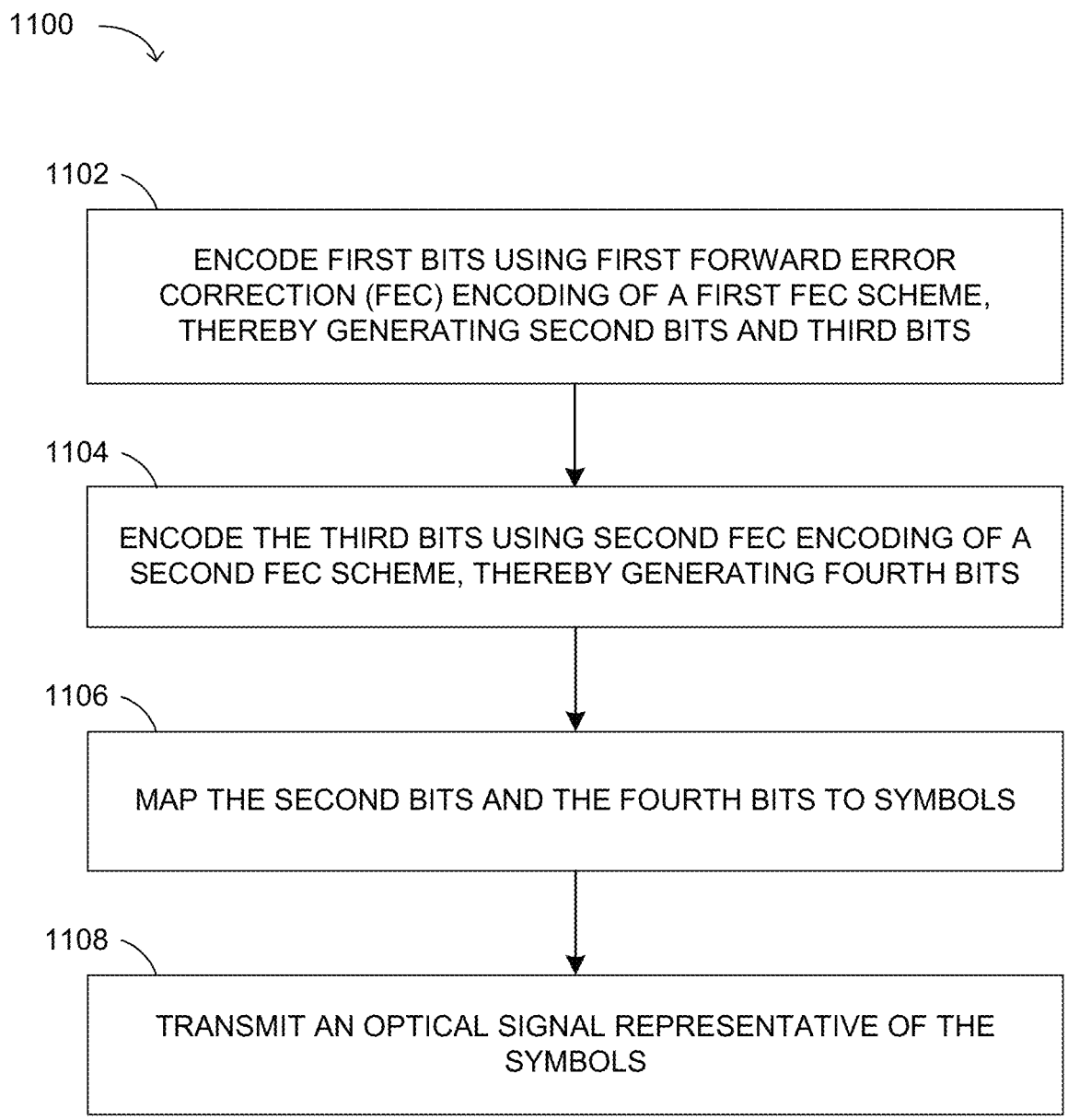
FIG. 11 illustrates an example method performed at an optical transmitter in accordance with the technology disclosed herein.

FIG. 11 illustrates an example method 1100 performed at an optical transmitter, such as the optical transmitter 900.

At 1102, the optical transmitter encodes first bits using first FEC encoding of a first FEC scheme, thereby generating second bits and third bits. The first bits may comprise, for example, the shaped bits 501 and the unshaped bits 503. The first FEC encoding may comprise, for example, the first FEC encoding 502. The second bits may comprise, for example, the FEC-encoded shaped bits 505. The third bits may comprise, for example, FEC-encoded unshaped bits 507 and the first parity bits 509.

At 1104, the optical transmitter encodes the third bits using second FEC encoding of a second FEC scheme, thereby generating fourth bits. The second FEC encoding may comprise, for example, the second FEC encoding 504. The fourth bits may comprise, for example, the FEC-encoded unshaped bits 511 which include the unshaped bits 503, the unshaped first parity bits 509, and the unshaped second parity bits.

At 1106, the optical transmitter maps the second bits generated at 1102 and the fourth bits generated at 1104 to symbols. The symbols may comprise, for example, the symbols 513. According to some examples, the mapping performed at 1106 may be based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is significantly greater than a minimum Euclidean distance of the set of constellation points. According to some examples, the fourth bits may be mapped to the one or more first positions in the label, and the second bits may be mapped to other positions in the label. The mapping performed at 1106 may comprise, for example, the mapping 508 or the mapping 908.

At 1108, the optical transmitter transmits an optical signal representative of the symbols generated at 1106. The optical signal may comprise, for example, the optical signal 964 generated as described with respect to FIG. 9.

Figure 12:
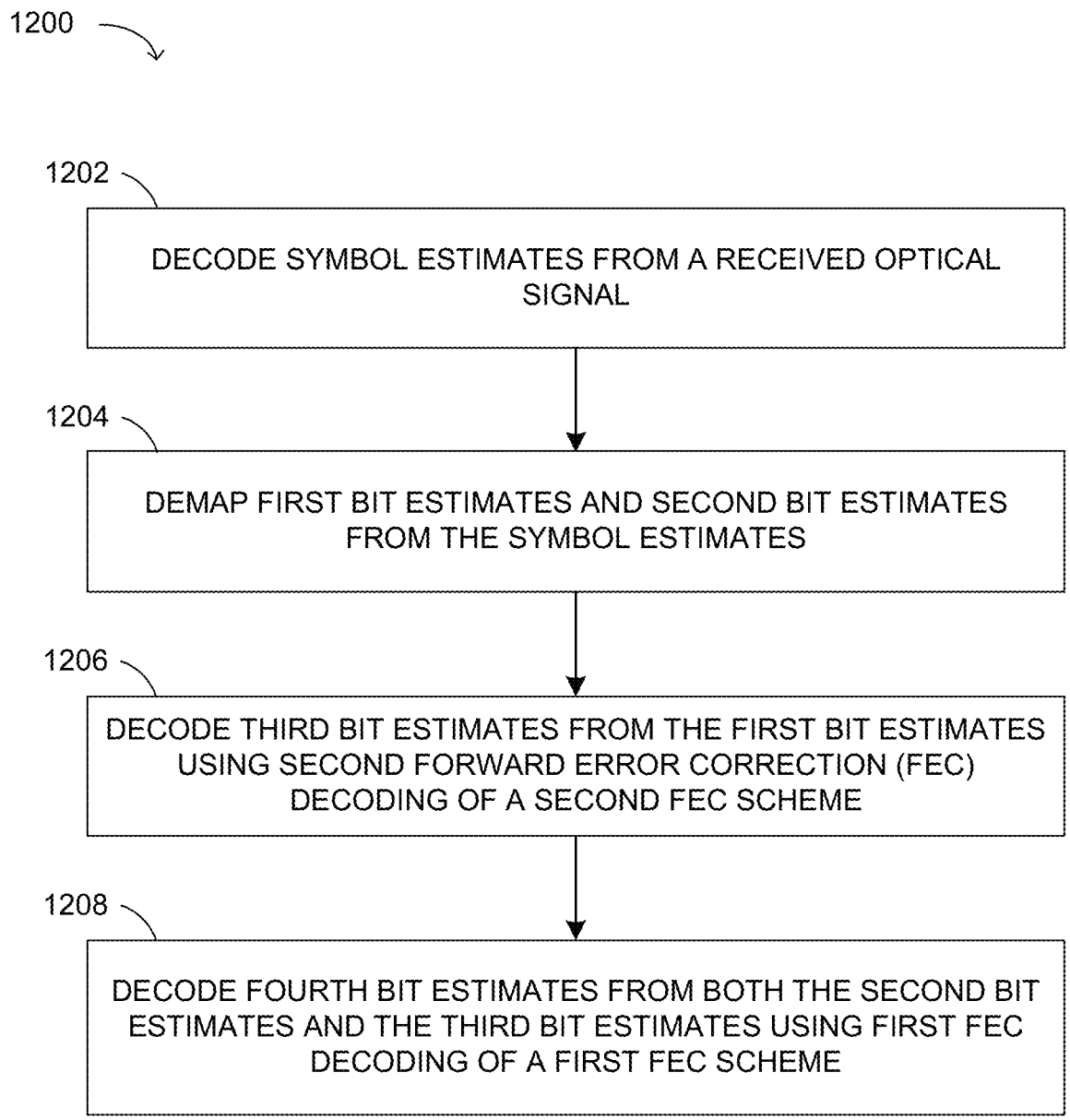
FIG. 12 illustrates an example method performed at an optical receiver in accordance with the technology disclosed herein.

FIG. 12 illustrates an example method 1200 performed at an optical receiver, such as the optical receiver 1200.

At 1202, the optical receiver decodes symbol estimates from a received optical signal. The received optical signal may comprise, for example, the optical signal 1064. The symbol estimates may comprise, for example, the symbol estimates 613.

At 1204, the optical receiver demaps first bit estimates and second bit estimates from the symbol estimates decoded at 1202. According to some examples, the demapping performed at 1204 may be based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is significantly greater than a minimum Euclidean distance of the set of constellation points. According to some examples, the first bit estimates may be demapped from the one or more first positions in the label, and the second bit estimates may be demapped from other positions in the label. The demapping performed at 1204 may comprise, for example, the demapping 608 or the demapping 1008. The first bit estimates may comprise, for example, the FEC-encoded unshaped bit estimates 611, and the second bit estimates may comprise, for example, the FEC-encoded shaped bit estimates 605.

At 1206, the optical receiver uses second FEC decoding of a second FEC scheme to decode third bit estimates from the first bit estimates decoded at 1204. The third bit estimates may comprise, for example, the partially-corrected unshaped bits 607 and the partially-corrected first parity bits 609. The second FEC decoding may comprise, for example, the second FEC decoding 604.

At 1208, the optical receiver uses first FEC decoding of a first FEC scheme to decode fourth bit estimates from both the second bit estimates demapped at 1204 and from the third bit estimates decoded at 1206. The fourth bit estimates may comprise, for example, the corrected shaped bits 601 and the corrected unshaped bits 603. The first FEC decoding may comprise, for example, the first FEC decoding 602.

According to some examples, the actions performed by the optical receiver in the method 1200 may be non-sequential and/or iterative. For example, the optical receiver may demap one or more of the second bit estimates at 1204 using one or more of the third bit estimates decoded at 1206. In this manner, the second bit estimates demapped at 1204 may have a BER that is significantly lower than a BER of the first bit estimates, since the demapping of the second bit estimates may be benefit from knowledge of the third bit estimates.

Alternatively, or additionally, the optical receiver may demap one or more of the second bit estimates at 1204 using one or more of the fourth bit estimates decoded at 1208. For example, the FEC-encoded shaped bit estimates 605 may be demapped using knowledge of the corrected unshaped bits 603.

Alternatively, or additionally, the optical receiver may demap one or more of the first bit estimates at 1204 using one or more of the fourth bit estimates decoded at 1208. For example, the FEC-encoded unshaped bit estimates 611 may be demapped using knowledge of the corrected shaped bits 601.

Alternatively, or additionally, the optical receiver may decode one or more of the third bit estimates at 1206 using one or more of the fourth bit estimates decoded at 1208. For example, the partially-corrected unshaped bits 607 and the partially-corrected first parity bits 609 may be decoded using knowledge of the corrected shaped bits 601.

The scope of the claims should not be limited by the details set forth in the examples, but should be given the broadest interpretation consistent with the description as a whole.

What is claimed is:

1. An optical transmitter configured to transmit optical signals representative of digital information over an optical communication link established between the optical transmitter and an optical receiver, the optical transmitter comprising:
   a processor; and
   a memory storing computer-executable instructions which, when executed by the processor, cause the optical transmitter
      to encode first bits using first forward error correction (PEC) encoding of a first FEC scheme, thereby generating second bits and third bits;
      to encode the third bits using second FEC encoding of a second FEC scheme, thereby generating fourth bits;
      to map the second bits and the fourth bits to symbols based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is greater than a minimum Euclidean distance of the set of constellation points; and
      to transmit an optical signal representative of the symbols.

2. The optical transmitter as claimed in claim 1, wherein the fourth bits are mapped to the one or more first positions in the label, and wherein the second bits are mapped to other positions in the label.

3. The optical transmitter as claimed in claim 1, wherein the first FEC scheme comprises a hard decision FEC scheme, and wherein the second FEC scheme comprises a soft decision FEC scheme.

4. The optical transmitter as claimed in claim 1, wherein a subset of the first bits comprises shaped bits having unequal probabilities of being zero and being one, and wherein the second bits are identical to the shaped bits.

5. An optical receiver con ii to receive optical signals representative of digital information over an optical communication link established between the optical receiver and an optical transmitter, the optical receiver comprising:
a processor, and
a memory storing computer-executable instructions which, when executed by the processor, cause the optical receiver
to decode symbol estimates from an optical signal received over the optical communication link;
to demap first bit estimates and second bit estimates from the symbol estimates based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is greater than a minimum Euclidean distance of the set of constellation points;
to decode third hit estimates from the first bit estimates using second forward error correction (FEC) decoding of a second FEC scheme; and
to decode fourth bit estimates from both the second bit estimates and the third bit estimates using FEC decoding of a first FEC scheme,
wherein one or more of the second bit estimates are demapped using one or more of the third bit estimates.

6. The optical receiver as claimed in claim 5, wherein the second bit estimates have a bit error rate (BER) that is lower than a BER of the first bit estimates.

7. The optical receiver as claimed in claim 5, wherein the first bit estimates are demapped from the one or more first positions in the label, and wherein the second bit estimates are demapped from other positions in the label.

8. The optical receiver as claimed in claim 5, wherein the first FEC scheme comprises a hard decision FEC scheme, and wherein the second FEC scheme comprises a soft decision FEC scheme.

9. The optical receiver as claimed in claim 5, wherein one or more of the second bit estimates are demapped using one or more of the fourth bit estimates.

10. The optical receiver as claimed in claim 5, wherein one or more of the first bit estimates are demapped using one or more of the fourth bit estimates.

11. The optical receiver as claimed in claim 5, wherein one or more of the third bit estimates are decoded using one or more of the fourth bit estimates.

12. A method performed at an optical receiver configured to receive optical signals representative of digital information over an optical communication link established between the optical receiver and an optical transmitter, the method comprising:
decoding symbol estimates from an optical signal received over the optical communication link;
demapping first bit estimates and second bit estimates from the symbol estimates based on a labeling scheme wherein each constellation point in a set of constellation points has a label comprising a unique sequence of bits, the unique sequence comprising a sub-sequence of bits located at one or more first positions in the label, and wherein a subset of constellation points for which the sub-sequence of bits is identical has a minimum Euclidean distance that is greater than a minimum Euclidean distance of the set of constellation points;
decoding third bit estimates from the first bit estimates using second forward error correction (FEC) decoding of a second FEC scheme; and
decoding forth bit estimates from both the second bit estimates and the third bit estimates using first FEC decoding of a first FEC scheme,
wherein one or more of the second bit estimates are demapped using one or more of the third bit estimates.

13. The method a claimed in claim 12, wherein the second bit estimates have a bit error rate (BER) that is lower than a BER of the first bit estimates.

14. The method as claimed in claim 12, wherein the first bit estimates are demapped from the one or more first positions in the label, and wherein the second bit estimates are demapped from other positions in the label.

15. The method as claimed in claim 12, wherein the first FEC scheme comprises a hard decision FEC scheme, and wherein the second FEC scheme comprises a soft decision FEC scheme.

16. The method as claimed in claim 12, wherein one or more of the second bit estimates are demapped using one or more of the fourth bit estimates.

17. The method as claimed in claim 12, wherein one or more of the first bit estimates are demapped using one or more of the fourth bit estimates.

18. The method as claimed in claim 12, wherein one or more of the third bit estimates are decoded using one or more of the fourth bit estimates.

* * * * *

UNITED STATES PATENT AND TRADEMARK OFFICE
CERTIFICATE OF CORRECTION

PATENT NO. : 10,848,270 B2  
APPLICATION NO. : 16/204735  
DATED : November 24, 2020  
INVENTOR(S) : Chunpo Pan Page 1 of 1

It is certified that error appears in the above-identified patent and that said Letters Patent is hereby corrected as shown below:

In the Claims

Column 24, Claim 1, Line 11, should read:  
"(FEC) encoding of a first FEC scheme, thereby"

Column 25, Claim 5, Line 1, should read:  
"5. An optical receiver configured to receive optical signals"

Column 25, Claim 5, Line 22, should read:  
"to decode third bit estimates from the first bit estimates"

Column 25, Claim 5, Line 26, should read:  
"estimates and the third bit estimates using first FEC"

Column 26, Claim 12, Line 19, should read:  
"using second forward error correction (FEC) decoding"

Column 26, Claim 12, Line 21, should read:  
"decoding fourth bit estimates from both the second bit"

Signed and Sealed this  
Twenty-second Day of December, 2020

Andrei Iancu  
*Director of the United States Patent and Trademark Office*